US007319506B2

(12) United States Patent
Den Boef et al.

(10) Patent No.: US 7,319,506 B2
(45) Date of Patent: *Jan. 15, 2008

(54) ALIGNMENT SYSTEM AND METHOD

(75) Inventors: Arie Jeffrey Den Boef, Waalre (NL);
Maarten Hoogerland, Auckland (NZ);
Boguslaw Gajdeczko, Princeton, NJ (US)

(73) Assignee: ASML Netherlands B.V., Veldhoven (NL)

( * ) Notice: Subject to any disclaimer, the term of this patent is extended or adjusted under 35 U.S.C. 154(b) by 222 days.

This patent is subject to a terminal disclaimer.

(21) Appl. No.: 11/210,683

(22) Filed: Aug. 25, 2005

(65) Prior Publication Data

US 2006/0007446 A1 Jan. 12, 2006

Related U.S. Application Data

(63) Continuation of application No. 10/456,972, filed on Jun. 9, 2003, now Pat. No. 6,961,116.

(30) Foreign Application Priority Data

Jun. 11, 2002 (EP) ................... 02254057

(51) Int. Cl.
G03B 27/42 (2006.01)
G03B 27/72 (2006.01)
G01B 11/00 (2006.01)
G03F 9/00 (2006.01)

(52) U.S. Cl. .................. 355/53; 355/71; 356/400; 356/401; 356/508; 356/509; 430/22

(58) Field of Classification Search .................. 355/53, 355/67, 68, 71, 77; 356/400, 401, 508, 509; 430/22, 311

See application file for complete search history.

(56) References Cited

U.S. PATENT DOCUMENTS

| 4,687,332 | A | 8/1987 | Bareket |
| 6,628,406 | B1 | 9/2003 | Kreuzer |
| 6,961,116 | B2 * | 11/2005 | Den Boef et al. ............ 355/53 |
| 2002/0037460 | A1 | 3/2002 | Takahashi |

FOREIGN PATENT DOCUMENTS

| EP | 1 148 390 A2 | 10/2001 |
| JP | 3-130638 | 6/1991 |

OTHER PUBLICATIONS

Moel et al., "Novel on-axis interferometric alignment method with sub-10 nm precision," *J. Vac. Sci. Technol. B*. 11(6):2191-2194 (1993).
Ota et al., "New Alignment Sensors for Wafer Stepper," *SPIE Optical/Laser Microlithography IV*: 1463:304-314 (1991).
T. Omatsu et al., "Time-resolved measurement of spatial coherence of a copper vapor laser beam using a reversal shear interferometer", Optics Communications, vol. 87, No. 5/6, pp. 278-286 (Feb. 15, 1992).
European Search Report issued in EP 03253494.3-2222 dated Mar. 3, 2006.

* cited by examiner

*Primary Examiner*—Alan Mathews
(74) *Attorney, Agent, or Firm*—Pillsbury Winthrop Shaw Pittman LLP

(57) ABSTRACT

An alignment system uses a self-referencing interferometer that produces two overlapping and relatively rotated images of an alignment marker. Detectors detect intensities in a pupil plane where Fourier transforms of the images are caused to interfere. The positional information is derived from the phase difference between diffraction orders of the two images which manifests as intensity variations in the interfered orders. Asymmetry can also be measured by measuring intensities at two positions either side of a diffraction order.

21 Claims, 12 Drawing Sheets

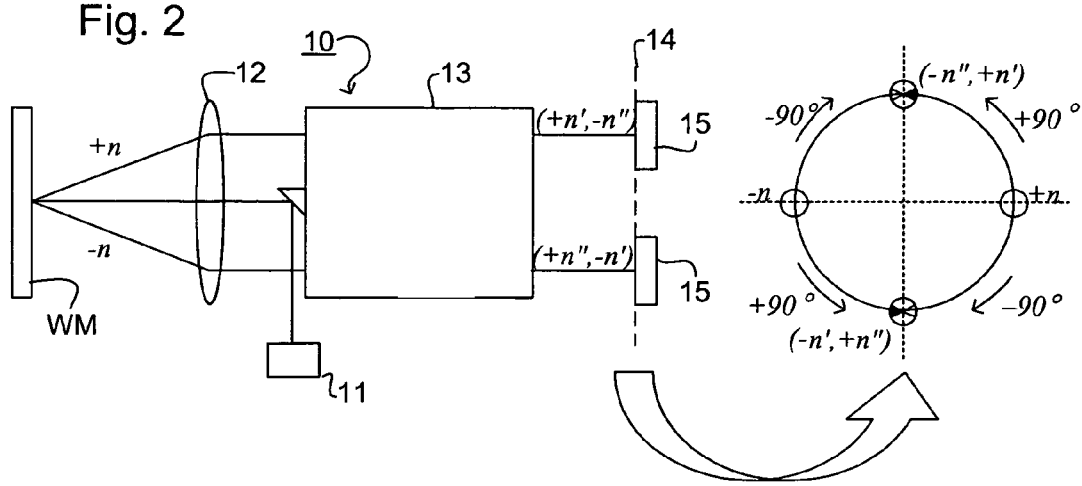
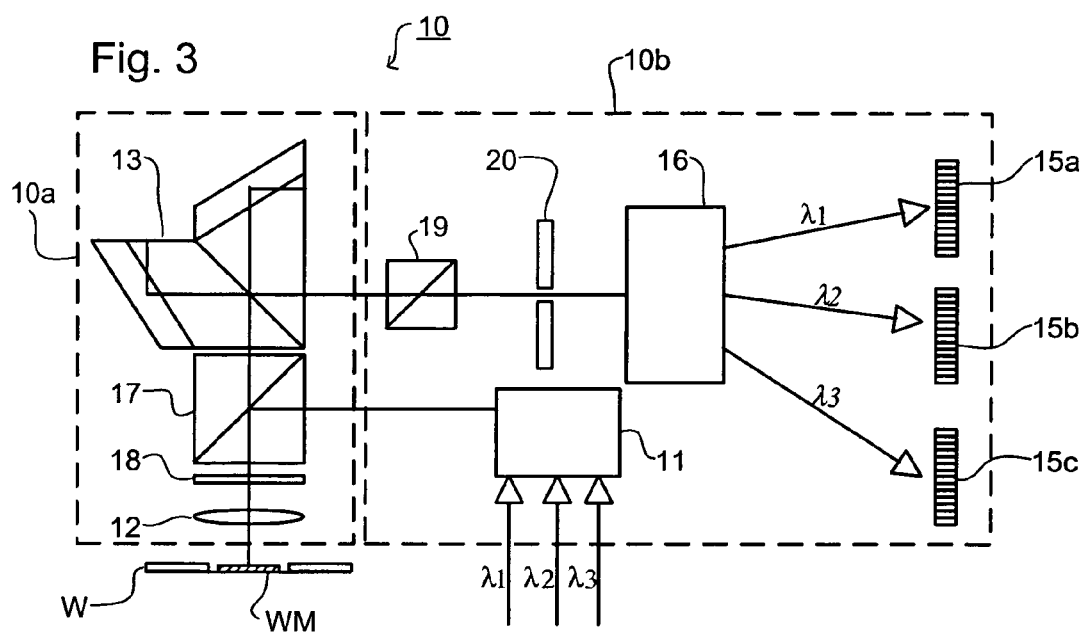
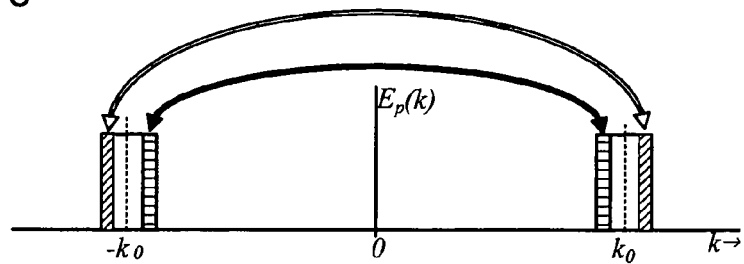

ALIGNMENT SYSTEM AND METHOD

CROSS REFERENCE TO RELATED APPLICATIONS

This application is a continuation of U.S. application Ser. No. 10/456,972, filed Jun. 9, 2003, now U.S. Pat. No. 6,961,116 which claimed priority to European Application 02254057.9, filed Jun. 11, 2002, the entire contents of both of which are incorporated herein by reference.

BACKGROUND OF THE INVENTION

1. Field of the Invention

The present invention relates to a lithographic projection apparatus, a device manufacturing method, and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

An essential step in a lithographic process is aligning the substrate to the lithographic apparatus so that the projected image of the mask pattern is at the correct position on the substrate. Semiconductor, and other, devices manufactured by lithographic techniques require multiple exposures to form multiple layers in the device and it is essential that these line up correctly. As ever smaller features are imaged, overlay requirements, and hence the necessary accuracy of the alignment process, become stricter.

In one known alignment system, described in U.S. Pat. No. 6,297,876, markers on the substrate comprise two pairs of reference gratings, one X and one Y, with the two gratings of the pair having slightly different periods. The gratings are illuminated with spatially coherent light and the diffracted light is collected and imaged on a detector array, the different diffraction orders having been separated so that corresponding positive and negative orders interfere. Each detector in the array comprises a reference grating and a photo detector. As the substrate is scanned, the output of the detector varies sinusoidally. When the signals from both gratings of a pair peak simultaneously, the marker is aligned. This type of system provides a large dynamic range and by using high diffraction orders, is insensitive to marker asymmetry. However, the need to provide two gratings with different periods increases the amount of space required for the alignment markers on the substrate. It is desirable to minimize the amount of such "silicon real estate" devoted to alignment marks and therefore not available for production of devices.

Another known alignment system, described in U.S. Pat. No. 6,628,406, uses a compact self-referencing interferometer to generate two overlapping images rotated over +90° and −90° which are then made to interfere in a pupil plane. An optical system and spatial filter selects and separates the first order beams and re-images them on a detector. This system has a number of advantages but requires 180° symmetry in the alignment markers.

SUMMARY OF THE INVENTION

It is an aspect of the present invention to provide an alignment system capable of capturing an alignment position using a single alignment mark and/or accommodating asymmetrical alignment marks.

This and other aspects are achieved according to the invention in an alignment system including a self-referencing interferometer configured to project two overlapping images of an alignment mark that are relatively rotated by 180°, and a light intensity detector system configured to detect light intensities at a plurality of different positions in a pupil plane of the self-referencing interferometer.

By detecting intensity in the pupil plane, the alignment system makes maximum use of the available information. For example, by detecting intensity variations at the positions of a plurality of diffraction orders in the pupil plane, extremely fine positioning information can be derived. This information is obtained from the relative phases in the intensity variations as the marker is scanned; the different diffraction orders will vary in intensity with different spatial frequencies. A central alignment position can be determined when several intensity peaks coincide. Alternatively, or in addition, by measuring intensity at two positions closely spaced on opposite sides of a diffraction order, a coarse position, or capture, can be obtained by detecting beat frequencies between the two intensity signals. The size of the capture range is determined by the spacing of the detectors—the closer the detectors, the larger the capture range. Furthermore, by detecting phase variations in dark areas of the pupil plane, asymmetries in the marker can be detected and used to compensate for errors in the alignment position caused by such asymmetries.

The alignment system of the present invention can be used with various different forms of markers, including those known in the prior art, providing valuable backwards compatibility. The alignment system of the present invention can also be made directly compatible with prior art alignment systems, allowing end users to make use, without modification, of marker arrangements and processes derived for earlier systems. Further, the alignment system can provide additional features and more accurate alignment.

The present invention can also use new alignment markers, having higher spatial frequencies than the prior art, providing improved robustness and accuracy of alignment. Additionally, a single frequency short grating can be used reducing the amount of scribe lane real estate devoted to alignment markers.

In embodiments of the invention, an unfiltered camera image of the marker can be provided. This image will be sharper and can be used for additional functions, such as capturing.

The present invention can also be embodied in a modular form where the front part has strict stability requirements and a back part has less strict stability requirements. The back part can be modified and upgraded without the need to change the front end.

According to a further aspect of the invention there is provided an alignment method including performing an alignment to an alignment mark on the substrate using a self-referencing interferometer that projects two overlapping images of the alignment mark that are relatively rotated by 180°, and measuring the intensities of light at a plurality of different positions in a pupil plane where Fourier transforms of the images of the alignment mark interfere.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams, and x-rays.

BRIEF DESCRIPTION OF THE DRAWINGS

Embodiments of the invention will now be described, by way of example only, with reference to the accompanying schematic drawings in which:

FIG. 2 depicts selected parts of the alignment system of the first embodiment, for explaining the concept of its operation;

FIG. 3 depicts the different modules of the alignment system of FIG. 2;

FIG. 5 is a diagram referred to in explaining interference in the pupil plane of the self-referencing interferometer of FIG. 4;

In the Figures, corresponding reference symbols indicate corresponding parts.

DETAILED DESCRIPTION

Figure 1:
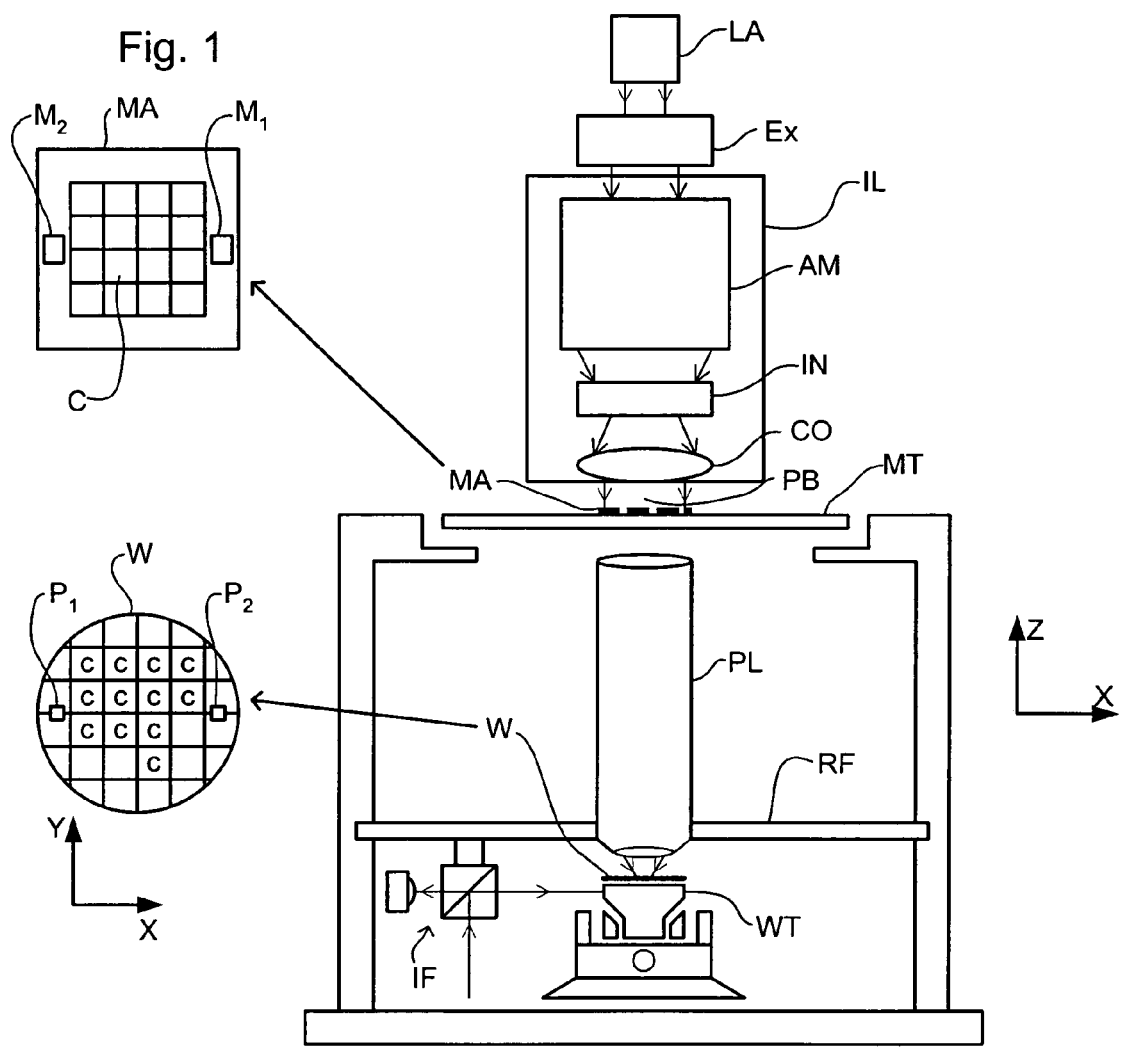
FIG. 1 depicts a lithographic projection apparatus according to a first embodiment of the invention.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In order to enable exposures to be correctly positioned on the substrate, the lithographic apparatus includes an alignment sensor 10 which can accurately measure the position of an alignment mark WM provided on the substrate W. In practice, the alignment sensor is fixed and the substrate W, held on the substrate table WT, is scanned underneath it until the alignment marker WM is captured by the alignment sensor. Then, the position of the substrate table when the alignment marker on the substrate is in correct alignment with the alignment sensor is noted. The alignment sensor 10 is an off-axis sensor meaning that it illuminates the alignment marker and detects the reflected light directly, rather than through the projection system PL. The alignment sensor 10 may be provided at the exposure station or at a separate measurement station or both. In the latter case, the alignment sensor may be used to measure the position of alignment markers on the substrate relative to a reference marker (fiducial) fixed to the substrate table WT. The position of the substrate table reference marker relative to the projection system PL is then measured once the substrate table has transferred to the exposure station and from this the position of the substrate markers relative to the projection lens is derived. This methodology may also be used if the alignment sensor is provided at an exposure station, alternatively the position of a reference in the alignment sensor relative to the projection lens may be accurately known so that the position of the alignment mark on the substrate can be determined directly. In general, the positions of at least two alignment markers on the substrate will be measured to determine the exact position and orientation of the substrate. The alignment system may also be used at the beginning and end of scan exposures to verify that the scan has been carried out at the correct position.

FIG. 2 is an overall schematic of the alignment system 10. A light source 11 emits a spatially coherent beam of radiation which illuminates marker WM which reflects the radiation into positive and negative diffraction orders +n, −n. These are collimated by objective lens 12 and enter self-referencing interferometer 13. The objective lens 12 may have a high NA, e.g. =0.6, allowing detection of marks with a small pitch of 1.5 μm using illumination radiation having a wavelength of 850 nm. The self-referencing interferometer outputs two images of the input with a relative rotation of 180° and which overlap and can therefore be made to interfere. In a pupil plane 14, the overlapping Fourier transforms of these images, with the different diffraction orders separated can be seen and can be made to interfere. Detectors 15 in the pupil plane detect the interfered diffraction orders to provide positional information, as explained further below. The right-hand part of FIG. 2 shows the formation of the overlapping images—one image +n', −n' is rotated by +90° relative to the input orders +n, −n and the second image +n", −n" is rotated by—90°.

The image rotator and interferometer 13 forms the heart of the alignment system and it is shown in FIG. 2 as a black box. A detailed explanation of this part is given below. The alignment system 10 has the advantage that the phase information in the entire pupil plane 14 is available and can be measured with a suitable detector array 15. A consequence of this is that it provides freedom of marker choice—the alignment system can align on any marker that has substantially a 180°—rotational symmetry. Indeed, as will be discussed below, a certain amount of asymmetry can be accommodated and detected.

Another attractive feature of the alignment system 10 is its modularity, shown in FIG. 3. The self-referencing interferometer 13 and the objective lens 12 form one compact unit (the front-end 10a) that needs to be stable. This front-end 10a generates the two overlapping wavefronts that contain the position information. The actual measurement of the phase difference in the pupil plane 14 is done in the back-end 10b of the sensor. This back-end 10b has less tight specifications on stability since the position information is already encoded in the front-end 10a. The non-critical back-end 10b contains the detector configuration 15, the light source multiplexor 11 and a wavelength de-multiplexor 16 to allow use of multiple wavelengths. This configuration determines the functionality that will be available to the end user.

An important advantage is the fact that design changes in the back-end 10b have no impact on the critical front-end 10a. The front-end 10a needs to be designed only once and needs no re-design if, for example, a different wavelength or a different grating period is needed.

The front-end 10a contains the interferometer 13, a beam splitter 17 for the illumination beam, a quarter wave plate 18 and the objective lens 12. In place of the beam splitter, it is also possible to use an angled plane plate with a small central silvered area to reflect the illumination beam onto the alignment marker. The back-end 10b may be embodied in various different forms but essentially contains components to perform the following functions: a polarizer 19 to create the interference pattern (the overlapping beams are orthogonally polarized); an aperture stop 20 to prevent product cross talk; a wavelength de-multiplexor 16 to split the various wavelengths on the detector side; and a detector array 15a-15b. As is explained below, the shape of the aperture stop may also be selected to avoid cross-talk between orders.

The availability of the entire pupil plane and the modularity of the back-end allow the construction of a flexible alignment sensor. New functions can be added with a relatively small design effort and the sensor can be made compatible with other alignment sensors at the application level, allowing users to continue to use processes, including masks and machine settings, developed for apparatus using other alignment sensors.

Figure 4:
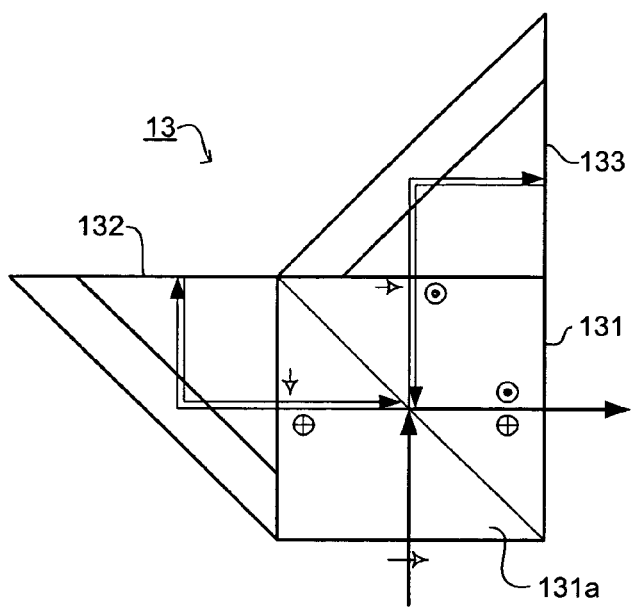
FIG. 4 is a simplified side view of the self-referencing interferometer used in the alignment system of FIGS. 2 and 3.

The self-referencing interferometer 13 achieves interference of opposite overlapping diffraction orders. This interferometer is a crucial part of the detection principle since drift or instability of this interferometer degrades the alignment accuracy. The interferometer 13 is shown in FIG. 4, a side view, and consists of three main parts: a polarizing beam splitter (PBS) 131 to split and recombine an incoming wavefront; and two prisms 132, 133 which reflect and rotate an incoming wavefront over 90°. The reflected and rotated wavefronts are also laterally displaced. Moreover the polarization is rotated over 90°. To minimize drift, the interferometer 13 is made of solid glass and the separate parts 131, 132, 133 are glued together. In practice, the interferometer 13 may be made from two solid glass parts, each comprising one of the prisms 132, 133 and half of the beam splitter 131, which are glued together along the reflecting plane 131a of the beam splitter 131.

The solid-headed arrows in FIG. 4 show the ray trace of a single beam of the incident wavefront while the open-headed arrows indicate the orientation of an incident wavefront and not the plane of polarization. Following the ray trace and the orientation of the wavefront shows that both prisms rotate the wavefront over 90° in the clockwise direction. The two recombined wavefronts have obtained a net 180° rotation relative to each other and are orthogonally plane polarized.

Further details of the operation of the rotation prisms can be found in EP-A-1,148 390, referred to above. It can be shown that the prisms can be modeled as optical elements that mirror and rotate any incoming beam.

Figure 6:
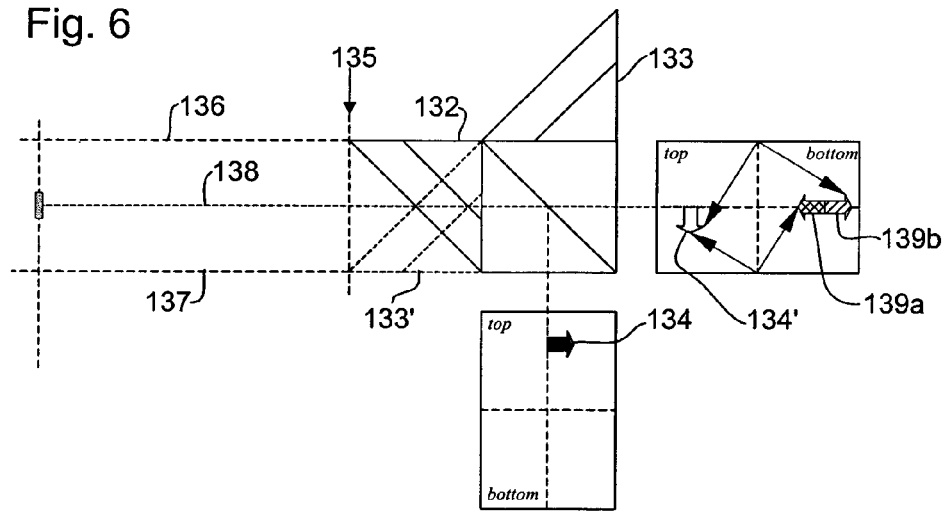
FIG. 6 is a view useful in explaining the function of the self-referencing interferometer of FIG. 4.

To explain the operation of the interferometer, FIG. 6 shows a rectangular input plane with an arrow-shaped object 134 that enters the interferometer 13. The input object 134 is split by the beam splitter 131 and enters the two rotation prisms 132, 133. For convenience, the second rotation prism 133 is also shown mirrored in the beam splitter plane in phantom 133'. This approach simplifies the explanation since we have now two overlapping interferometer branches: a 'real' one with the first prism and a 'virtual' branch with the second prism.

Due to the symmetry of the interferometer 13, the virtual mirror planes 135 of both prisms 132, 133 coincide. However, the rotation axes 136, 137 of the two prisms are at opposite sides of the center line 138 of the interferometer 13. The virtual mirror plane 135 creates a virtual image 134' of the input object 134. The mirrored image 134' is shown as an open arrow in the figure. This image, however, is only shown here for convenience and is in reality not present because of the additional rotation of the two prisms.

The two rotation axes 136, 137 are placed at opposite sides of the center of the interferometer branches. As a result, the image is rotated in opposite directions The +90° rotation and -90° rotation result in, respectively, cross-hatched and diagonal hatched arrows 139a, 139b. The two arrows face in opposite directions (so the net rotation is indeed 180°) and the feet of the arrows are connected which indicates that the location of the feet is an invariant point of the interferometer.

Figure 7:
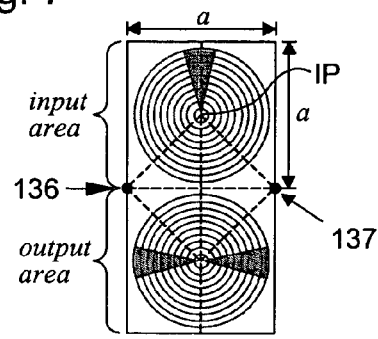
FIG. 7 is a drawing of the input and output planes of the interferometer showing the invariant point.

FIG. 7 shows a graphical construction of the invariant point. The interferometer has a rectangular input and output plane of width a and height 2a. The field entering the interferometer occupies the top half of the interferometer (inputarea) and is mirrored downward over the center of symmetry and rotated over +90° and -90° by the two prisms. These overlapping fields are present in the output area. The rotation axes are separated by a distance a as shown in the figure. It can be readily verified graphically that the invariant point IP is the exact center of the input area.

Concentric circles around the invariant point IP are imaged onto themselves with a relative rotation of 180° as indicated by the cross- and diagonally-hatched slices. The benefit of the lateral displacement over a distance a of the input and the output is the fact that optical feedback into the alignment radiation source (e.g. a laser) is prevented.

Figure 8:
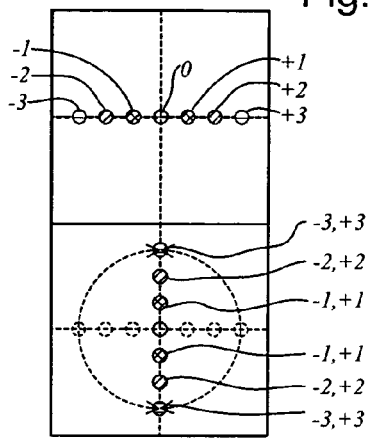
FIG. 8 is a drawing of the input and output planes of the interferometer showing the rotation of diffraction orders in the output.

It is now easy to see how overlapping diffraction orders are generated with this interferometer. The 0-order is projected on the rotation invariant point and the even and odd diffraction orders rotate around this point as shown in FIG. 8.

The alignment system 10 requires a spatially coherent light source, preferably a laser since thermal and gas-discharge light sources can only be made spatially coherent by throwing away a lot of light. To avoid some interference problems it is preferable to use light with a short temporal coherence.

Accordingly, the preferred light source 11 is a laser diode as such diodes are spatially coherent and their coherence length can be easily spoiled by applying an RF modulation to the injection current. It is desirable to use illumination of several distinct frequencies, e.g. about 532 nm, 635 nm, 780 nm and 850 nm. As well as diodes emitting at these frequencies, it is possible to use frequency doubled sources, such as a frequency doubled Nd:YAG laser with a phase modulator (see U.S. Pat. No. 6,384,899), or fiber lasers.

The design of the illumination optics is driven by two conflicting requirements. In order to maximize the signal strength and minimize product crosstalk a small spot is desired that illuminates only the marker. On the other hand, a small spot complicates the capturing process. Moreover, the alignment accuracy is more affected by spot position variations.

Product crosstalk can be effectively suppressed with aperture stops and with the availability of high-power lasers, alignment performance is rarely limited by signal strength.

For this reason, the illumination spot size is at least larger than the marker size. Assuming a marker size of the order of 50×50 μm² and a required capturing range of the same order, a spot diameter of the order of 100 μm is suitable.

As regards the shape of the illumination spot, again there are conflicting requirements with the angular extent of the illumination beam in the pupil plane. The angular size of the beam must be kept as small as possible to allow the use of coarse gratings as the marker. A small angular extent, however, leads to an excessively large illumination spot so an optimum trade-off must be found between angular extent and spot shape. The $1^{st}$ order of a 16 μm grating is diffracted at an angle of 40 radians for λ=633 nm. To measure such a low spatial frequency, the angular size of the illumination beam must be limited to a diameter of about 40 mrad.

In the alignment system 10, the illumination spot is circularly polarized to enable illumination and detection light to be separated with the aid of polarizing beam splitter 17 and a 0-order quarter wave plate 18 as shown in FIG. 3.

For coarse gratings with a pitch much greater than the wavelength of the illumination beam, the choice of polarization is not very important. However, where the marker pitch is of the same order as the wavelength, the diffraction efficiency depends on the polarization, and in the extreme case, the alignment marker can acts as a polarizer that diffracts only polarization component. For such markers, circularly polarized light is advantageous. In the case of linearly polarized light there is always a chance that the efficiency of a grating is very low for one particular orientation. Circularly polarized light contains two orthogonally polarized components (with a 90° phase shift) so there is always one component that will efficiently diffract the light.

In order to suppress spurious reflections it is possible to apply a minor tilt to the polarizing beam splitter 17 and the quarter wave plate 18. The tilt angle must be chosen carefully to minimize aberrations that are introduced by this tilt. Of course, it is also possible to correct for such aberrations in the design of the objective lens.

The interferometer produces two orthogonally polarized (virtual) images of the pupil E(k) where k is a spatial frequency. The total optical field in the pupil plane 14 is the original field plus a 180° rotated copy of this field. The intensity in the pupil plane is:

$$I(k,x_0) = |E_p(k,x_0) + E_p(-k,x_0)|^2 \quad (1).$$

If two detectors 15 with a width 2Δk are placed at positions k=$k_0$ and k=$-k_0$ in the pupil plane 14, the optical powers $P_1$ and $P_2$ captured by these detectors are given by:

$$P_1(x_0) = \int_{-k_0-\Delta k}^{-k_0+\Delta k} |E_p(k,x_0)|^2 \, dk + \quad (2)$$

$$\int_{-k_0-\Delta k}^{-k_0+\Delta k} |E_p(-k,x_0)|^2 \, dk +$$

$$\int_{-k_0-\Delta k}^{-k_0+\Delta k} E_p(k,x_0)E_p^*(-k,x_0)\,dk +$$

$$\int_{-k_0-\Delta k}^{-k_0+\Delta k} E_p^*(k,x_0)E_p(-k,x_0)\,dk; \text{ and}$$

$$P_2(x_0) = \int_{k_0-\Delta k}^{k_0+\Delta k} |E_p(k,x_0)|^2 \, dk + \quad (3)$$

$$\int_{k_0-\Delta k}^{k_0+\Delta k} |E_p(-k,x_0)|^2 \, dk +$$

$$\int_{k_0-\Delta k}^{k_0+\Delta k} E_p(k,x_0)E_p^*(-k,x_0)\,dk +$$

$$\int_{k_0-\Delta k}^{k_0+\Delta k} E_p^*(k,x_0)E_p(-k,x_0)\,dk.$$

FIG. 5 shows the signal formation graphically. Because of the mirror operation, the horizontally hatched areas overlap and interfere and the diagonally hatched areas overlap and interfere. The phase difference between the two fields contains the position information.

The two images of the pupil are orthogonally and linearly polarized and interference between them is therefore not visible in the form of intensity variations (fringes). In order to translate phase variations in intensity variations, the two images of the pupil must have the same polarization which is realized with a polarizing optical element, which may be a dichroic sheet polarizer, a regular polarizing beam splitter based on a multi-layer coating, or a birefringent beam splitter such as a Savart plate, a Wollaston Prism, a Glan-Taylor beam splitter or a "wire grid" polariser.

Dichroic sheet polarizers are not preferred because of their limited optical quality and they are often less effective in the near-IR region. Moreover, these sheet polarizers throw away 50% of the photons. A multi-layer beam splitter is far better but the wavelength range over which a good extinction ratio is achieved maybe limited. Birefringent beamsplitters have excellent extinction ratios over a large wavelength range but the birefringence may lead to temperature drift since the birefringence is temperature dependent.

If a beam splitter is used as polarizer 19, the field incident on it has a Jones vector:

$$\vec{J} = \begin{pmatrix} E(k) \\ E(-k) \end{pmatrix}. \quad (4)$$

The polarizing beam splitter is oriented at 45° relative to the orientation of E(k) and E(-k) so the intensities that are transmitted, $I_1(k)$, and coupled out, $I_2(k)$, by the beam splitter are:

$$I_1(k) = \frac{1}{2}|E(k)|^2 + \frac{1}{2}|E(-k)|^2 + \quad (5)$$

$$|E(k)||E(-k)|\cos(\varphi(k) - \varphi(-k)); \text{ and}$$

$$I_2(k) = \frac{1}{2}|E(k)|^2 + \frac{1}{2}|E(-k)|^2 - \quad (6)$$

$$|E(k)||E(-k)|\cos(\varphi(k) - \varphi(-k)).$$

As can be seen, the two intensities vary in anti-phase and the total intensity equals the intensity that is incident on the beam splitter. Thus, both branches contain position information and can be used for alignment. This means that it is possible to use one branch for x-position detection and the other for y-position detection, allowing use of rectangular aperture stops to avoid product crosstalk. Alternatively, one branch can be used with a small aperture stop for fine alignment and the other branch with a large aperture stop for capturing. A further alternative is to use one branch for one set of wavelengths and the other branch for another set of wavelengths.

Alignment markers are often placed in the scribe lane very close to product structures which may lead to product cross-talk: light scattered by the product influences the alignment signal. Product cross-talk can be strongly attenuated by using a sufficiently small illumination beam. However, a small illumination beam is not preferred for various reasons. With a small illumination beam, the stability of the position of the illumination spot becomes more critical. For example, in the extreme case of a scanning spot, drift in the illumination spot results directly in alignment position drift. Also, capturing becomes more critical since there is a greater chance that the marker is very poorly illuminated after the substrate W is loaded on the substrate table WT. Finally, a greater illumination NA is needed which makes the detection of coarse gratings more demanding.

For these reasons it is desirable to use a large illumination spot, for example with a $1/e^2$ width of roughly three times the maximum marker diameter. The consequences of such a large spot are that product structures are illuminated and that the optical power on the marker decreases. However, the latter item is not a serious problem since a sufficiently powerful light source can be provided.

Figure 9:
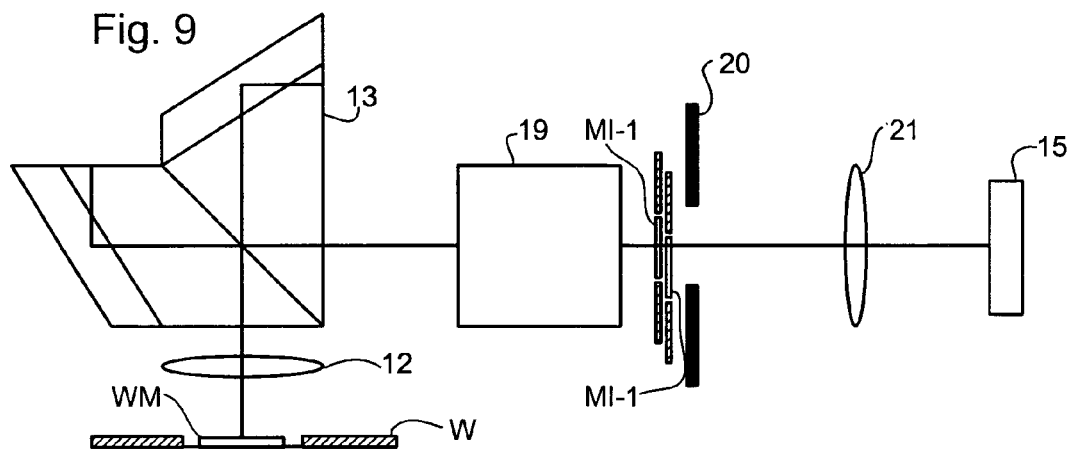
FIG. 9 is a drawing of optical component of the alignment system used to explain the use of an aperture step to eliminate cross-talk from product structures.

The issue of product crosstalk can be solved with aperture stops that are placed at an intermediate image of the marker, as shown in FIG. 9. Since the alignment system 10 requires no spatial filtering and the high NA of the objective lens 12 guarantees a sharp image of the marker and aperture stop 20 can provide very effective suppression of product crosstalk.

Because of the interferometer with the rotation prisms, two marker images are projected onto the aperture stop 20: a normal image MI-1 and an inverted image MI-2. These images move in opposite directions when the marker is scanned. In the scanning direction the aperture stop 20 must be sufficiently long to contain the entire marker. In the non-scanning direction (i.e. perpendicular to the scribe lane) the aperture stop 20 can be made arbitrarily narrow. The actual width of the aperture is a trade-off between product crosstalk and signal strength.

During a scan of a marker, diffraction effects can occur when the marker image overlaps the edge of the aperture (field) stop. When this occurs, the detected signal is the convolution of the aerial image of the marker and the window function of the field stop. If the field stop has sharp edges, part of a diffraction order leaks into the neighboring diffraction order, causing crosstalk. This crosstalk can be suppressed by apodisation of the field stop in the scan direction, i.e. by providing "soft" edges to the field stop. Possible methods to provide soft edges to the field stop include: a transmittance gradient at the field edges, a shark teeth profile on the field edges, slanted edges or rounded edges. If a shark teeth profile is used, the spatial frequency must be sufficiently high to avoid diffraction effects in the non-scanning direction. Slanted or rounded edges require the marker to be wider than the field stop in the non-scanning direction but that will normally be the case since the field stop is also to prevent product crosstalk. Slanted or rounded edges are preferred since any desired window function can be realized by suitable choice of the shape of the field stop.

Figure 10:
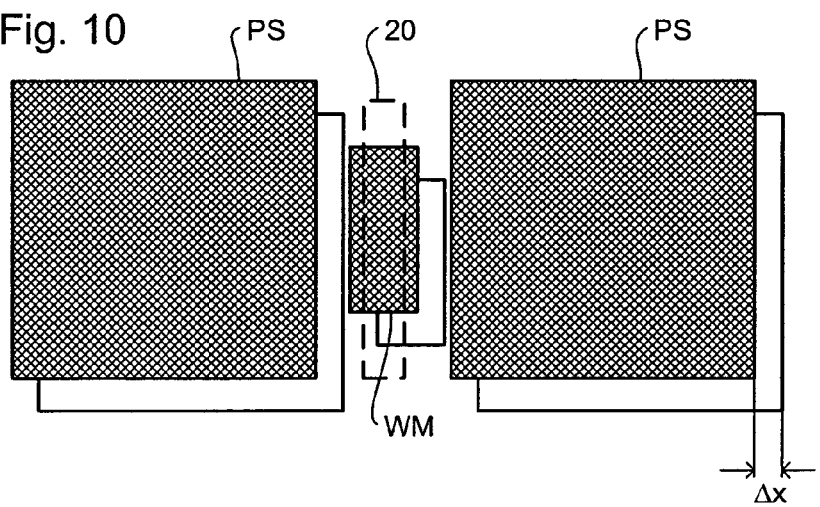
FIG. 10 is a drawing of marker and product structures showing the contour of the aperture stop.

After a substrate W is loaded on the substrate WT, a coarse alignment is needed for capturing. During a y-coarse alignment, a large x-offset, $\Delta x$, can be present which leads to the situation shown in FIG. 10. The actual position of the marker WM and product structures PS, shown in outline, may differ by the offset $\Delta x$ from the expected position, shown cross-hatched. If the width of the aperture stop 20 were equal to the scribe lane width, SL-W, light from the product structures PS could leak through the aperture stop 20. For this reason the aperture stop 20 is smaller than the scribe lane width.

In practice it is desirable to have rectangular aperture stops for the x and y-directions. The two outputs of the polarizing beam splitter 19 can could be used for these two directions as mentioned above. Alternatively a spatial light modulator (SLM), for example an LCD array, can be used as a programmable aperture stop. The optical quality of an SLM is not critical since the position information is already encoded in the interferometer.

Figure 11:
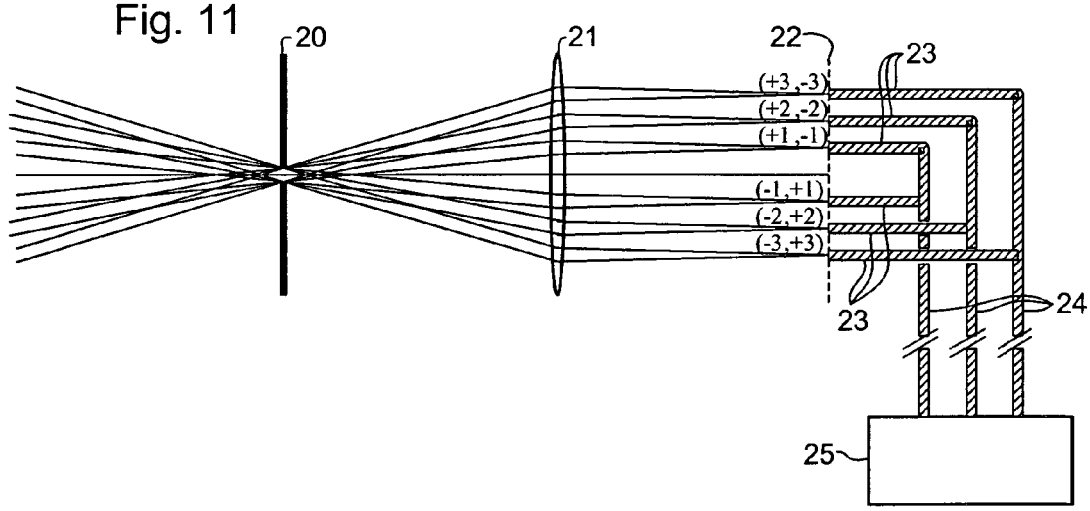
FIG. 11 depicts the detection arrangement of the alignment system of the first embodiment of the invention.

According to the invention, the detection array 15 is placed in a pupil plane, preferably the pupil plane 22 after the aperture stop 20. The simplest detector configuration is shown in FIG. 11. For simplicity only the lowest 3 orders and one wavelength is shown. Moreover, the zero order is not shown either. Two multimode detection fibers 23 collect the light from each order. The light leaving these two fibers can be coupled into one multimode fiber 24 and sent to remote photo detectors 25.

This approach is simple and provides functionality compatible with a known sensor. However, extra functionality can easily be added by providing an extra wavelength output or extra orders since the NA of the objective lens 12 can be high.

In order to be more flexible towards marker pitches or allow the measurement of non-periodic markers such as boxes or frames a detector array can be used. This detector array also allows the possibility of accurate asymmetry detection as discussed below. For the detector array, a number of options are possible: a bundle of multimode fibers, discrete pin detectors per channel, or CCD or CMOS (linear) arrays.

The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

If two-dimensional data acquisition is needed for maximum flexibility then massive parallelism is required, increasing the complexity of the electronics. A great deal of flexibility is possible if the data acquisition is restricted to two orthogonal directions so that linear detector arrays can be used.

Figure 12:
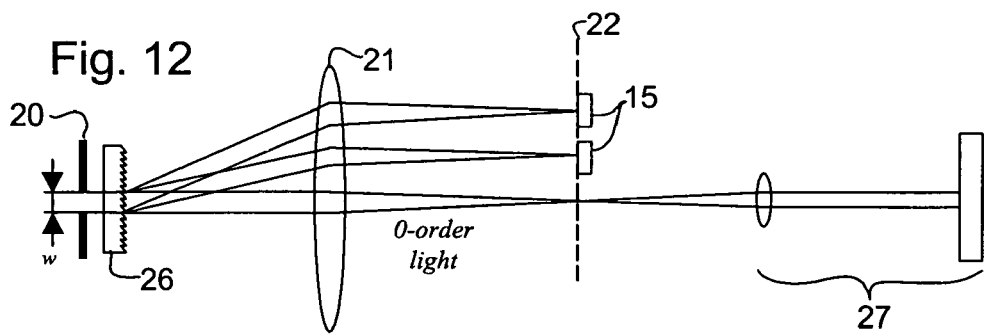
FIG. 12 depicts a possible arrangement for color separation in the alignment system of the first embodiment of the invention.

As mentioned above, the marker is preferably illuminated by several different wavelengths that must be separately detected. It is possible to use dichroic optics to separate the different colors. Alternatively, a blazed grating as a dispersive element can be used and offers flexibility in adding extra wavelengths. Blazed gratings have a sawtooth grating shape and they have the property that they diffract most of the light in only one order. An arrangement using a blazed grating 26 is shown in FIG. 12. Again the detectors 15 are placed in the pupil plane 22. A weak zero order is available as input for a camera 27. If the blazed grating is optimized for the $1^{st}$ order and has a pitch $P_b$ then the diffraction angle of the $1^{st}$ order is:

$$\sin(\theta_d) = \frac{\lambda}{P_b}. \tag{7}$$

The choice of grating pitch is determined by the required wavelength separation. If the wavelength separation is $\Delta\lambda$ then the corresponding angular wavelength dispersion is:

$$\Delta\theta_d = \frac{\Delta\lambda}{\sqrt{P_b^2 - \lambda^2}}. \tag{8}$$

The finite width w of the aperture 20 yields an angular divergence of:

$$\Delta\theta_w = \frac{\lambda}{w}. \tag{9}$$

Using the requirement that the wavelength dispersion must be greater than the angular divergence due to diffraction ($\Delta\theta_d > \Delta\theta_w$) yields:

$$\Delta\lambda > \lambda \sqrt{\frac{P_b^2 - \lambda}{w^2}}. \tag{10}$$

The shortest wavelength yields the highest requirement on wavelength separation. For example, if w=20 μm, the wavelength separations for various different wavelengths are given in Table 1 below:

TABLE 1

| | $\Delta\lambda$ [nm], @ w = 20 μm | | |
|---|---|---|---|
| λ [nm] | $P_b$ = 1.5 μm | $P_b$ = 1.2 μm | $P_b$ = 1.0 μm |
| 532 | 37 | 29 | 23 |
| 633 | 43 | 32 | 25 |
| 780 | 50 | 36 | 24 |
| 850 | 53 | 36 | 22 |

Blazed gratings are normally optimized around one central wavelength. In this case the central wavelength would be (532+850)/2=691 nm. At the extreme values of the wavelength range (532 and 850 nm) the efficiency of the grating will be reduced. However, this is acceptable since the available laser power at these wavelengths is very high. Moreover, the 0-order diffraction that occurs at these wavelengths can be used for the camera image.

Normally the marker is scanned during phase grating alignment. This scanning movement puts the phase difference on a carrier with temporal frequency $2k_x v_x$:

$$I(k,t) = I_0 + I_1 \cos(\phi_k - \phi_{-k} + 2kv_x t). \tag{11}$$

Demodulating this signal yields the marker position according to:

$$x_m = \frac{\varphi_k - \varphi_{-k}}{2k}. \tag{12}$$

When the marker is scanned it moves along the aperture. As a result, structures inside the scribe lane and adjacent to the marker move into the detection aperture and this may distort the alignment signal. This distortion is similar to product crosstalk and it can be avoided by a suitable separation between (metrology) markers in the scribe lane.

However, scanning is only needed to introduce the carrier frequency that is required for an accurate phase measurement. By using a variable retarder, phase-modulated interferometry can be used as well to extract the phase information $\phi_k - \phi_{-k}$. In this technique the marker remains stationary and the retarder is used to apply a well-known phase variation $\psi(t)$ to the interference pattern in the pupil plane:

$$I(k,t) = I_0 + I_1 \cos(\phi_k - \phi_{-k} + \psi(t)) \tag{13}.$$

In practice two forms of phase-modulation can be used: equidistant-phase stepping which results in Fourier transform interferometry and harmonic phase modulation $\psi(t) = \hat{\psi} \cos(\Omega t)$.

The use of phase-modulated interferometry may allow a denser packing of metrology structures (like alignment markers) in the scribe lane. It should be noted that phase-modulated interferometry can also be used in other forms of alignment sensor.

As will now be described, it is also possible to measure marker asymmetry from the phase of the light in the pupil plane. First, the theoretical background will be described and then some example results and practical implementation.

The complex near-field reflected by the marker is:

$$E_{nf}(x, x_0) = E_{ill}(x) r(x - x_0) \tag{14},$$

wherein $E_{ill}(x)$ is the complex optical field of the fixed illumination beam and $r(x - x_0)$ is the complex amplitude reflectance of the marker which has an offset $x_0$. This offset is the unknown marker position that must be measured with the alignment sensor.

The complex reflected near field can always be decomposed into symmetric (=even) and anti-symmetric (=odd) functions with an offset $x_0$. So without loss of generality if it can be determined that:

$$\begin{aligned} E_{nf}(x, x_0) &= a_e(x - x_0) + a_o(x - x_0) + \\ &\quad j[b_e(x - x_0) + b_o(x - x_0)] \\ &= a_e(x - x_0) + jb_e(x - x_0) + \\ &\quad a_o(x - x_0) + jb_o(x - x_0). \end{aligned} \tag{15}$$

The subscripts 'e' and 'o' are used to denote even and odd functions, respectively. By definition, these functions have the property $f_e(x) = f_e(-x)$ and $f_o(x) = -f_o(-x)$. Note that this expression of the near field is completely generic and not yet restricted in any way. In other words, the above description of the near field covers all processing effects and illumination imperfections.

The field $E_p(k, x_0)$ in the pupil is the Fourier transform (FT) of $E_{nf}(x, x_0)$ $$E_p(k, x_0) = \int_{-\infty}^{\infty} E_{nf}(x, x_0) e^{-jkx} dx. \tag{16}$$

The FT of an even function is even and real and the FT of an odd function is odd and imaginary. These fundamental properties yield the following expression for the field in the pupil:

$$E_p(k, x_0) = [A_e(k) + jB_e(k)]e^{jkx_0} + [jA_o(k) - B_o(k)]e^{jkx_0} \tag{17}$$

The real-valued functions $A_e(k)$, $A_o(k)$, $B_e(k)$ and $B_o(k)$ are the Fourier Transforms of the functions $a_e(k)$, $a_o(k)$, $b_e(k)$ and $b_o(k)$. This equation provides little useful properties in this generic formulation. However, it is possible to derive some useful properties of $E_p(k, x_0)$ by considering a number of special cases, such as a symmetric amplitude object (all terms are zero except $a_e(x){\neq}0$), a symmetric complex object, or an asymmetric complex object (all terms$\neq 0$).

The field in the pupil of a symmetric amplitude marker is:

$$E_p(k,x_0)=A_e(k)e^{jkx_o} \qquad (18)$$

The phase $\phi$ in the pupil plane varies linearly with k and is a function of only the marker position $x_0$:

$$\phi(k)=kx_0 \qquad (19).$$

The amplitude $A_e(k)$ is an even function of k and independent of the marker position. For this particularly simple marker type the position can be unambiguously determined by measuring the slope of the phase of $E_p(k,x_0)$:

$$x_0 = \frac{d\psi(k)}{dk}. \qquad (20)$$

For a symmetric marker with a complex reflection coefficient, the field in the pupil becomes:

$$E_p(k, x_0) = [A_e(k) + jB_e(k)]e^{jkx_0} \qquad (21)$$
$$= I_e(k)e^{j[\psi_e(k)+kx_0]}$$

The intensity $I_e(k)$ and phase $\psi_e(k)$ are both even functions given by:

$$I_e(k)=A_e^2(k)+B_e^2(k) \qquad (22); \text{ and}$$

$$\psi_e(k)=\arg(A_e(k)+jB_e(k)) \qquad (23).$$

The phase in the pupil is no longer a straight line so a phase measurement between two arbitrary points in the pupil plane does not necessarily result in a correct measurement of the position. However, it can be readily shown that the phase difference between two conjugate points in the pupil k and −k is independent of the marker shape and only determined by the marker position. So the intensity in the pupil plane of the alignment system 10 is:

$$I(k) = |E_p(k, x_0) + E_p(-k, x_0)|^2 \qquad (24)$$
$$= I_e(k) + I_e(-k) + 2\sqrt{I_e(k)I_e(-k)}\cos(\psi_e(k) - \psi_e(-k) + 2kx_0)$$
$$= I_e(k) + I_e(-k) + 2\sqrt{I_e(k)I_e(-k)}\cos(2kx_0)$$

It must be noted that this equation describes the ideal situation where the points with opposite spatial frequencies exactly overlap. In the alignment system 10, the overlapping fields in the pupil move in opposite directions when the marker is tilted. So in the presence of a small marker tilt (or an imperfect sensor adjustment) the intensity in the pupil is:

$$I(k) = |E_p(k + \Delta k, x_0) + E_p(-k + \Delta k, x_0)|^2 \qquad (25)$$
$$= I_e(k + \Delta k) + I_e(-k + \Delta k) + 2\sqrt{I_e(k + \Delta k)I_e(-k + \Delta k)}\cos(\psi_e(k + \Delta k) - \psi_e(-k + \Delta k) + 2kx_0)$$
$$= I_e(k + \Delta k) + I_e(-k + \Delta k) + 2\sqrt{I_e(k + \Delta k)I_e(-k + \Delta k)}\cos\left(2\frac{d\psi_e(k)}{dk}\Delta k + 2kx_0\right)$$

The derivative of an even function is always an odd function and an extra linear phase variation is introduced if the even phase variation has a parabolic component. This linear phase variation gives rise to alignment offsets. This observation is basically an alternative description of the focus dependency effect. When the marker is defocused, the field in the pupil plane obtains a parabolic phase variation and when the marker is tilted an alignment offset is made.

For an asymmetric marker with a complex reflection coefficient, the field in the pupil becomes:

$$E_p(k, x_0) = [A_e(k) + jB_e(k)]e^{jkx_0} + [jA_o(k) - B_o(k)]e^{jkx_0} \qquad (26)$$
$$= [Z_e(k) + Z_o(k)]e^{jkx_0}$$
$$= [|Z_e|e^{j\psi_e(k)} + |Z_{oe}|e^{j\psi_i(k)}]e^{jkx_0}$$

The amplitude of the asymmetric part is given by:

$$|Z_{oe}(k)|=\sqrt{A_o^2(k)+B_o^2(k)} \qquad (27).$$

This equation shows that the amplitude must be an even function so $|Z_{oe}(k)|=|Z_{oe}(-k)|$. The phase $\psi_i$ is given by:

$$\psi_i(k)=\arg(jA_o(k)-B_o(k)) \qquad (28).$$

Due to the odd properties of $A_o(k)$ and $B_o(k)$ the phase $\psi_i$ has the property:

$$\psi_i(k)=\psi_i(-k)+\pi \qquad (29).$$

Due to the asymmetry, the amplitude of the field in the pupil changes and an extra phase term $\phi(k)$ is introduced:

$$E_p(k, x_0) = Z(k)e^{jkx_0} \qquad (30)$$
$$= |Z|e^{j(\psi_e(k)+\phi(k))}e^{jkx_0}$$

Figure 13:
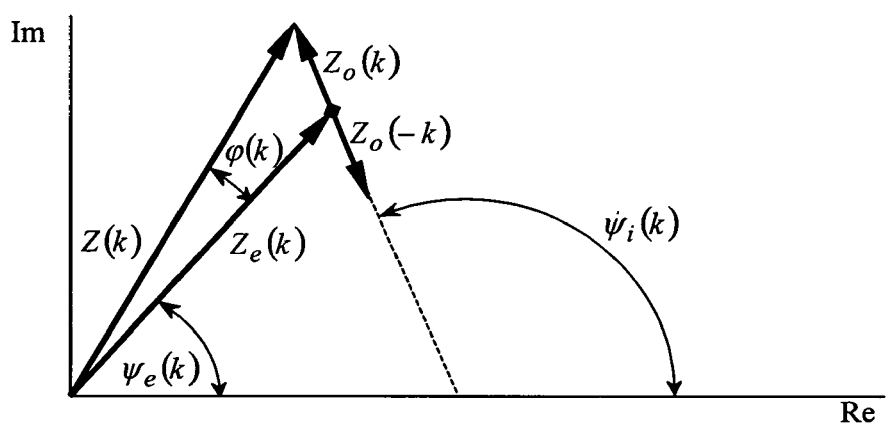
FIGS. 13, 14 and 15 are vector diagrams referred to in explaining detection of asymmetric markers.

FIG. 13 clarifies how Z is constructed. This Figure also shows how the additional phase term $\phi(k)$ is introduced by the asymmetric component $Z_o(k)$. FIG. 13 shows that the phase term $\phi(k)$ has the property $\phi(k)\phi(-k){\leq}0$ so $\phi(k)$ contains always an odd component and possibly a small (but irrelevant) even component.

Without applying any restrictions to the type of asymmetry we can write for the phase term $\phi(k)$ and the amplitude Z(k):

$$\tan(\psi(k)) = \frac{|Z_{oe}(k)|\sin(\psi_i - \psi_e)}{|Z_e(k)| + |Z_{oe}(k)|\cos(\psi_i - \psi_e)}; \text{ and} \quad (31)$$

$$|Z(k)| = \sqrt{|Z_e(k)|^2 + |Z_{oe}(k)|^2 + 2|Z_e(k)||Z_{oe}(k)|\cos(\psi_i - \psi_e)}. \quad (32)$$

These equations are quite complex since no assumptions have yet been made about the nature of the asymmetry. There are two special situations that clarify the use of these equations. In the first case $Z_e(k)$ is perpendicular to $Z_{oe}(k)$. In that case we have $$\psi_i(k) - \psi_e(k) = \frac{\pi}{2}; \quad (33)$$

which yields:

$$\tan(\varphi(k)) = \frac{|Z_{oe}(k)|\sin(\psi_i - \psi_e)}{|Z_e(k)|}; \text{ and} \quad (34)$$

$$|Z(k)| = \sqrt{|Z_e(k)|^2 + |Z_{oe}(k)|^2}. \quad (35)$$

For this situation we can write for the phase and the amplitude:

$$\phi(k) = -\phi(-k) \quad (36); \text{ and}$$

$$|Z(k)| = |Z(-k)| \quad (37).$$

Figure 14:
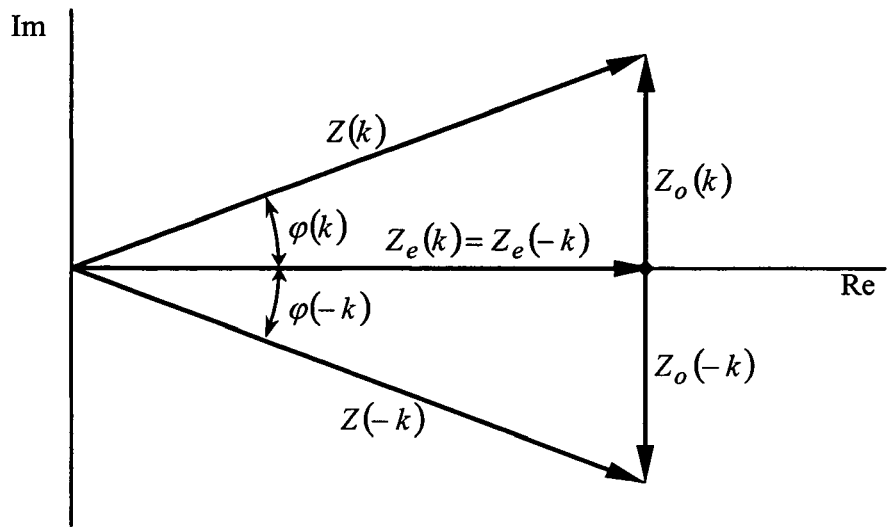

So the phase is a pure odd function which leads to an alignment error when a measurement is done at the spatial frequency k. This first case is shown in FIG. 14.

In the second special case $Z_e(k)$ is parallel to $Z_o(k)$ so $$\psi_i(k) - \psi_e(k) = 0 \quad (k>0)$$

$$\psi_i(k) - \psi_e(k) = \pi \quad (k<0) \quad (38); \text{ and}$$

which yields:

$$\varphi(k) = 0$$

$$|Z(k)| = |Z_e(k)| + |Z_{oe}(k)| \quad (k > 0). \quad (39)$$

$$|Z(k)| = |Z_e(k)| - |Z_{oe}(k)| \quad (k < 0)$$

Figure 15:
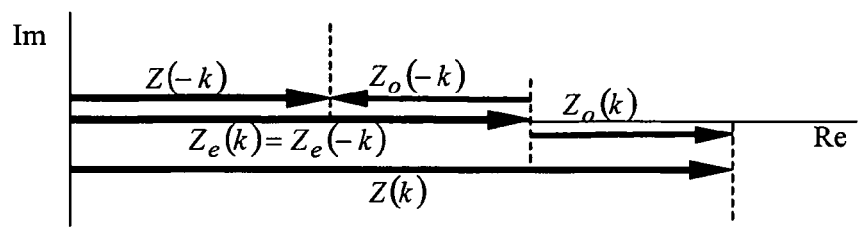

In this situation, the asymmetry introduces no anti-symmetric phase terms (and thus no phase errors) but it results in an asymmetry of the amplitude. This is shown in FIG. 15.

The expression for $\phi(k)$ is too complex to continue using it. However, as stated before, it can be decomposed into a symmetric and an anti-symmetric part:

$$\varphi(k) = \varphi_e(k) + \varphi_o(k) \quad . \quad (40)$$

$$\varphi_e(k) = \sum_{n=0}^{\infty} c_{2n} k^{2n}$$

$$\varphi_o(k) = \sum_{n=0}^{\infty} c_{2n+1} k^{2n+1}$$

The even phase variation is irrelevant since only odd phase variations are detected. Moreover, as stated earlier, the position information is contained in the slope of the net phase in the pupil plane so we only need to consider phase terms that vary linearly with k.

The total phase variation $\Psi_d(k)$ as detected by the alignment system 10 is:

$$\Psi_d = \varphi_o(k) - \varphi_o(-k) + 2kx_0 \quad . \quad (41)$$

$$= 2(c_1 + x_0)k + 2c_3 k^3 + 2c_5 k^5 + \cdots + 2c_{2n+1} k^{2n+1} + \cdots$$

This equation states an important and very fundamental problem of marker asymmetry in alignment: the slope of the phase in the pupil is no longer unambiguously determined by the marker position $x_0$ but is also determined by an unknown asymmetry via the term $c_1$.

Fortunately, the higher order terms ($c_3$, $c_5$ etc.) of the measured phase $\Psi_d(k)$ are only a function of the unknown asymmetry and here lies a solution to this problem. A measurement of the higher order terms may allow a determination of the linear asymmetry term $c_1$.

In many cases the field in the pupil consists of bright areas (large amplitude $|Z|$) and dark areas (small amplitude $|Z|$). For example, the bright areas correspond to the odd diffraction orders of a 50% duty-cycle grating. The even orders of such a grating are the dark areas. In the bright areas we have $|Z_e|>>|Z_{oe}|$ and the phase variation introduced by asymmetry will be small and can be approximated by:

$$\varphi(k) \cong \frac{|Z_{oe}(k)|}{|Z_e(k)|} \sin(\psi_i - \psi_e). \quad (42)$$

Usually $\phi(k)$ will be very small and barely varies with small changes in asymmetry that may be caused by process variations. In principle these bright areas can be used to measure the higher order terms but the measurement accuracy may be too limited.

However, in the darker areas of the field in the pupil the situation becomes totally different. In these areas we have $|Z_e|\cong|Z_{oe}|$ and small changes in asymmetry due to process variations cause large variations in the phase since:

$$\varphi(k) = \arctan\left[\frac{|Z_{oe}(k)|\sin(\psi_i - \psi_e)}{|Z_e(k)| + |Z_{oe}(k)|\cos(\psi_i - \psi_e)}\right]. \quad (43)$$

As can be seen, when $Z_{oe}(k)$ is comparable in magnitude compared to $Z_e(k)$ the phase varies strongly with k.

The theory of asymmetry detection will now be further explained with reference to a one-dimensional example. The marker is illuminated with an intensity profile shown in FIG. 16. The optical power of the incident beam is 1 mW and the full width is roughly 100 µm. The wavelength of the illumination beam is 633 nm.

Figure 17:
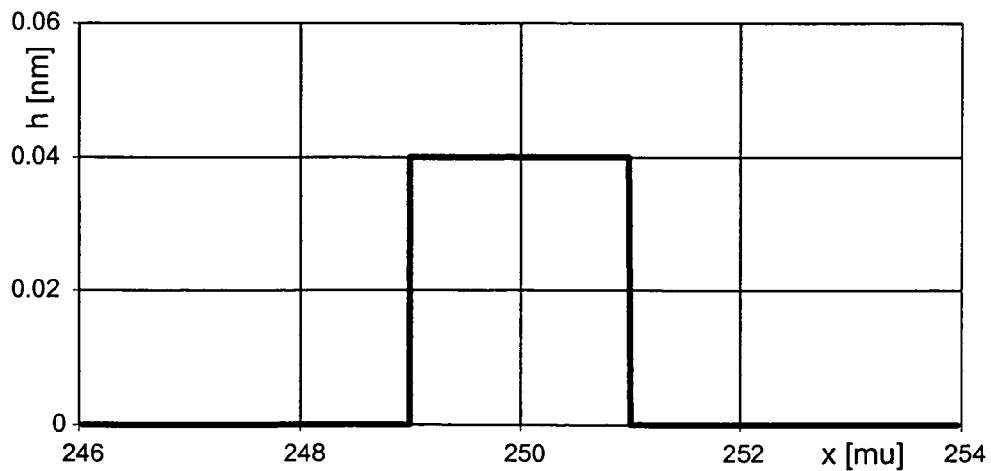
FIG. 17 is a diagram of a one-dimensional marker in the example of the invention.

The marker is an isolated 2 µm wide bar with a depth of 40 nm as shown in FIG. 17. It is centered at x=250 µm. The example is 1-dimensional so the bar extends to infinity in the y-direction. The reflection coefficient of this bar is unity. The extension of this marker to a periodic structure (i.e. a grating) is discussed later.

Figure 16:
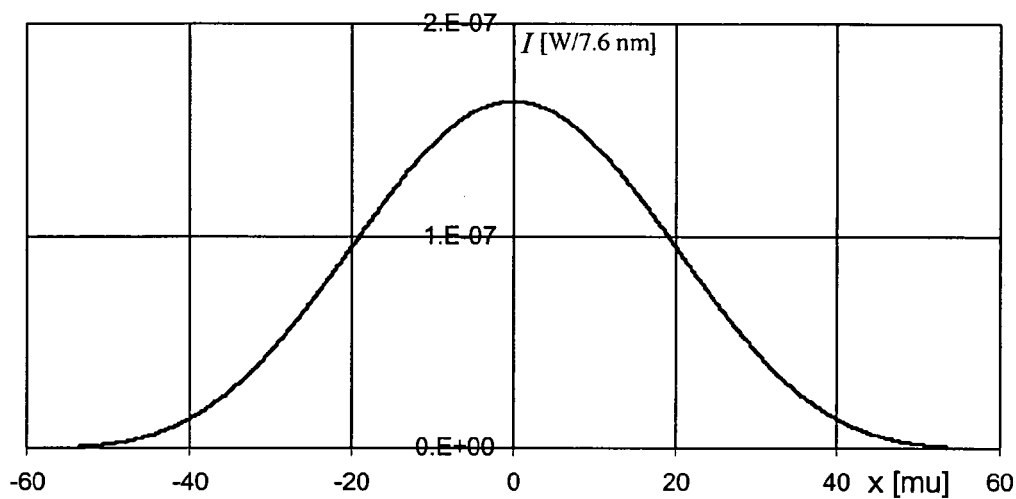
FIG. 16 is a graph of the intensity profile used to illuminate a one-dimensional mark in an example of the functioning of the invention.
Figure 18:
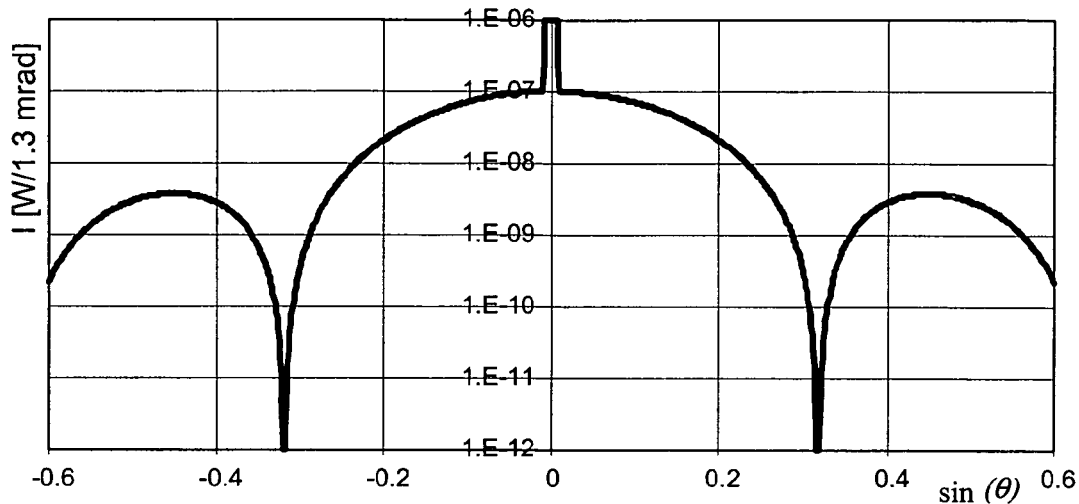
FIG. 18 is a graph of intensity distribution in the far field in the example of the invention.

The bar has a relatively small phase depth and is also very small compared to the width of the illumination spot (note the different scales in FIGS. 16 and 17). Consequently, the reflected light will have a very strong specular reflection and only a very small amount of light will be diffracted. This is clearly demonstrated in the intensity distribution in the far field as shown in FIG. 18.

The strong specular peak is clearly visible and reaches a peak intensity of $1.5 \times 10^{-4}$ W/1.3 mrad. The full width of the specular reflection is 20 mrad and it can be verified through integration that practically all the incident power is specularly reflected. The diffracted light reaches a peak intensity of only $1.5 \times 10^{-7}$ W/1.3 mrad so a detector with an aperture of 5 mrad captures a total optical power of only 0.6 µW. The intensity is zero for $\sin(\theta) \approx 0.32$ which would be the location of the second diffraction order if this 2 µm wide bar were repeated with a 4 µm period.

Figure 19:
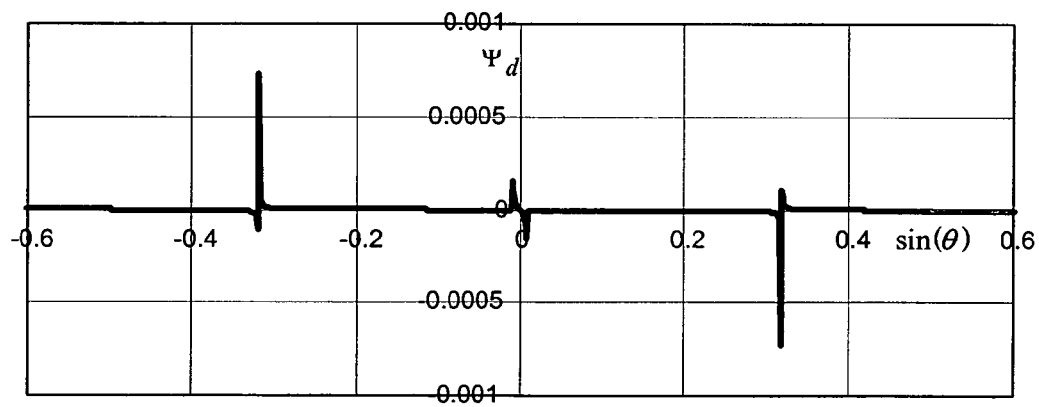
FIG. 19 is a graph of measured phase as a function of far field angle in the example of the invention.

The marker is perfectly symmetric so the phase difference as detected by the alignment system 10 should yield a perfectly straight line with a slope that is proportional to the marker position. This is clearly visible in FIG. 19 which shows the measured phase as a function of far-field angle.

The small spikes are numerical anomalies that are located at the points of zero intensity. In practice these points correspond to phase-singularities that occur in areas with zero intensity. Apart from these numerical artifacts it can be clearly seen that the phase is a straight line with zero slope which indicates that the marker is at the aligned position.

Figure 20:
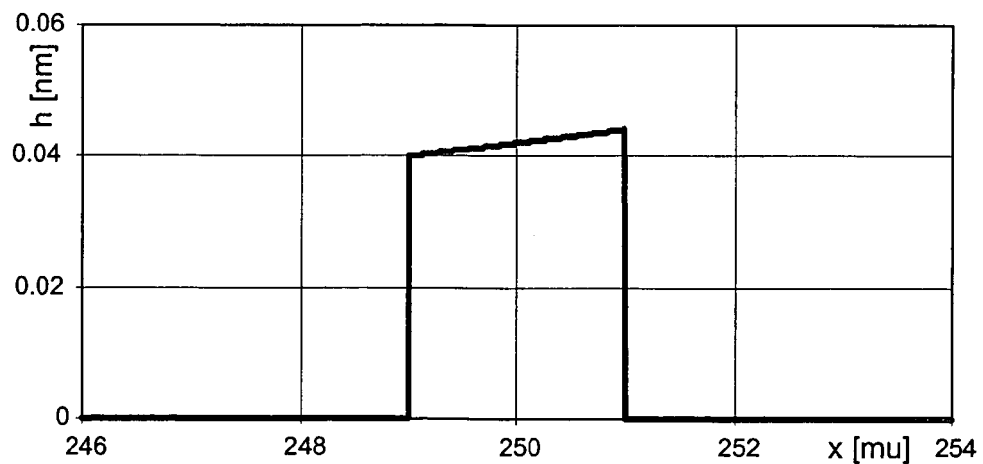
FIG. 20 is a diagram of an asymmetric mark in a second example of the functioning of the invention.

However, we now introduce a small amount of asymmetry by adding a classical rooftop. As an example we take a rooftop of 4 nm which results in the marker shape shown in FIG. 20.

Figure 21:
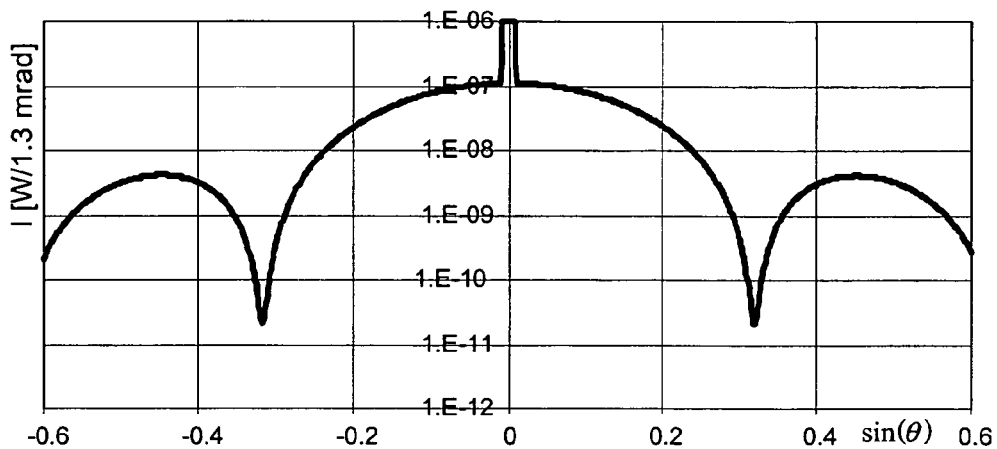
FIG. 21 is a diagram of intensity in the far field in the second example of the invention;.

FIG. 21 then shows the intensity of the light in the pupil plane. Compared to the symmetric case, the shape has barely changed. However, the intensity in the dark area has increased considerably. This is already an indication that variations in the 'dark' areas in the pupil plane are a good indicator of (changes in) asymmetry.

The intensity in the dark area reaches a minimum of about $2 \times 10^{-11}$ W/1.3 mrad. This is a very low intensity and to enable a measurement in this area it is useful to calculate how many photons are actually captured during the measurement. Assuming a detection angle of 1 mrad and an acquisition time of 30 ms, a total photon energy of $4.6 \times 10^{-13}$ J is captured. The energy of 1 photon is about $3.13 \times 10^{-19}$ J so the total amount of photons incident on the detector is:

$$N_{ph} = \frac{4.6 \times 10^{-13}}{3.13 \times 10^{-19}}. \tag{44}$$

$$\approx 1.5 \times 10^6$$

Figure 22:
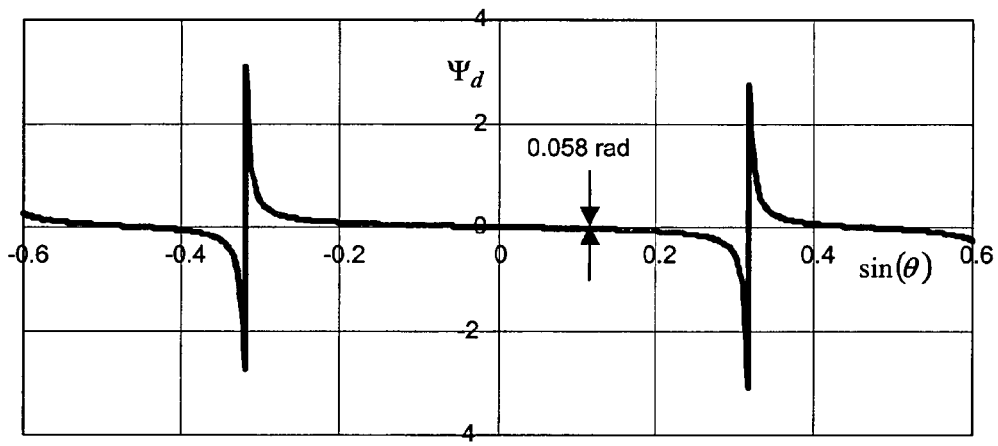
FIG. 22 is a graph of measured phase as a function of far field angle in the second example.

This calculation shows that accurate phase measurements in the dark areas are possible. The phase variation as measured by the alignment system is shown in FIG. 22.

Compared to the symmetric case, the measured phase has changed dramatically. In the bright areas the phase has obtained an almost linear slope which is responsible for alignment offsets. For example, at $\sin(\theta)=0.16$ a small phase error of 0.058 radians occurs as indicated in the graph. This point in the pupil corresponds to the location of the $1^{st}$ order that would be present if the marker were repeated with a 4 µm period. The phase error is small but, unfortunately, it shows up as a large alignment error $\Delta x$ of:

$$\Delta x = \frac{0.058}{4\pi} \times 4 \ \mu m. \tag{45}$$

$$\cong 18 \ nm$$

Figure 23:
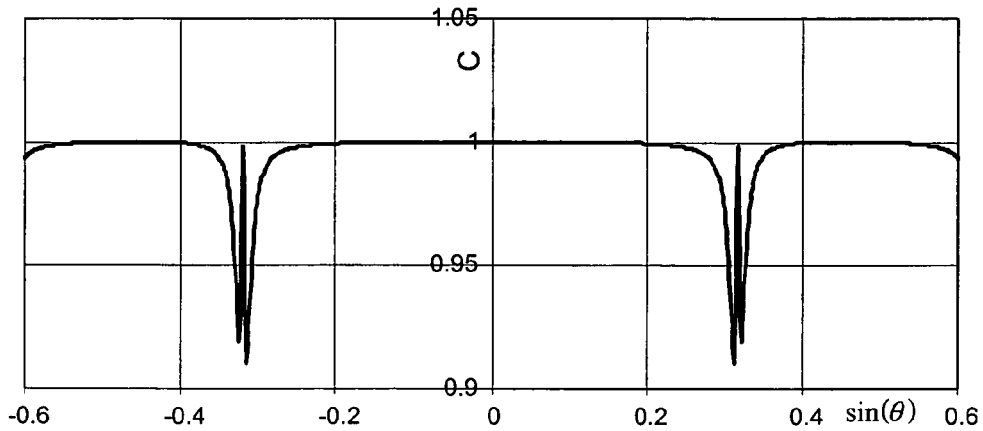
FIG. 23 is a graph of contrast of the interference signal as a function of angle in the far field in the second example.

Fortunately, the asymmetry that is responsible for this offset can be very clearly detected in the dark area of the pupil plane. It can be very clearly seen that the measured phase shows an extremely large and non-linear variation in the area around $\sin(\theta)=0.32$. FIG. 23 shows the contrast of the interference signal that is detected.

The contrast curve of FIG. 23 indicates that the contrast is sufficiently high to allow accurate phase measurements. However, it must be emphasized that other asymmetry types may exist where the contrast can be significantly degraded.

Figure 24:
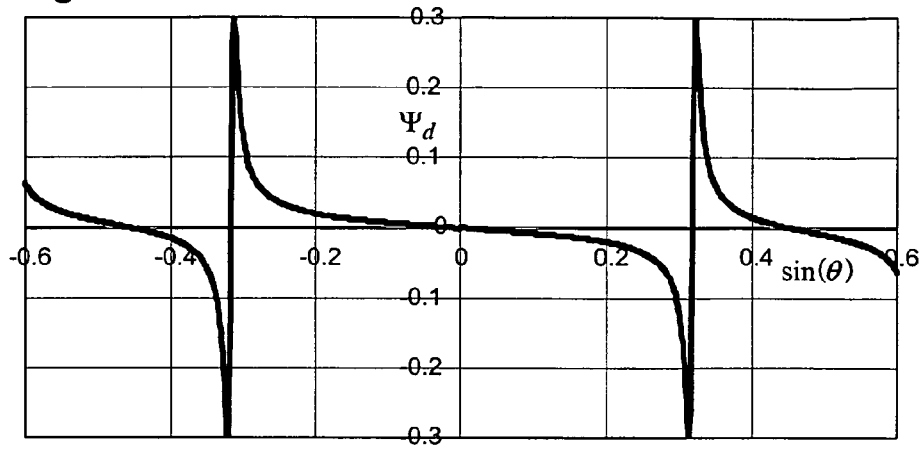
FIG. 24 is a graph of phase variation in a third example of the functioning of the invention.

In practice it is perhaps even more important to be able to detect changes in asymmetry (i.e. process variation). FIG. 24 shows the phase variation for a rooftop change of 1 nm. This correspond to a process variation of 18 nm/4=4.5 nm. The resulting phase variation is of the order of 0.1 radians which is measurable based on the photon statistics.

In practice, the isolated structure discussed above will be periodically repeated to concentrate the scattered light in discrete diffraction orders. This periodic repetition, however, does not change the concept of asymmetry measurement since this periodic repetition only influences the even phase distribution $\psi_e(k)$ and the amplitude $|Z(k)|$ of the field in the pupil. The odd phase variation that is introduced by the asymmetry is unchanged.

The complex reflection coefficient of the isolated structure is $r(x)$ and this structure results in a complex field $Z(k)$ in the pupil. A periodic repetition of this structure N times to the left and N time to the right with a period $X_p$ creates a grating of 2N+1 copies of $r(x)$:

$$r_g(x) = \sum_{n=-N}^{N} r(x - n.X_p). \tag{46}$$

Fourier transforming this expression and using the Fourier shift theorem yields for the complex field $Z_g(k)$ in the pupil:

$$Z_g(k) = Z(k) \sum_{n=-N}^{N} e^{-jknX_p} \tag{47}$$

$$= Z(k) \left[ 1 + \sum_{n=1}^{N} 2\cos(knX_p) \right]$$

$$= Z(k) f(k)$$

It can be seen that $Z_g(k)$ is obtained by multiplying $Z(k)$ with a real valued even function $f(k)$. This function can become negative which gives rise to phase jumps in $Z_g(k)$. These phase jumps, however, are always symmetrical. The amplitude of $Z_g(k)$ peaks when $kX_p=m2\pi$ where m is an integer. This is merely a mathematical formulation of the grating law since the spatial frequency k is given by:

$$k = 2\pi \frac{\sin(\theta)}{\lambda}. \tag{48}$$

Figure 25:
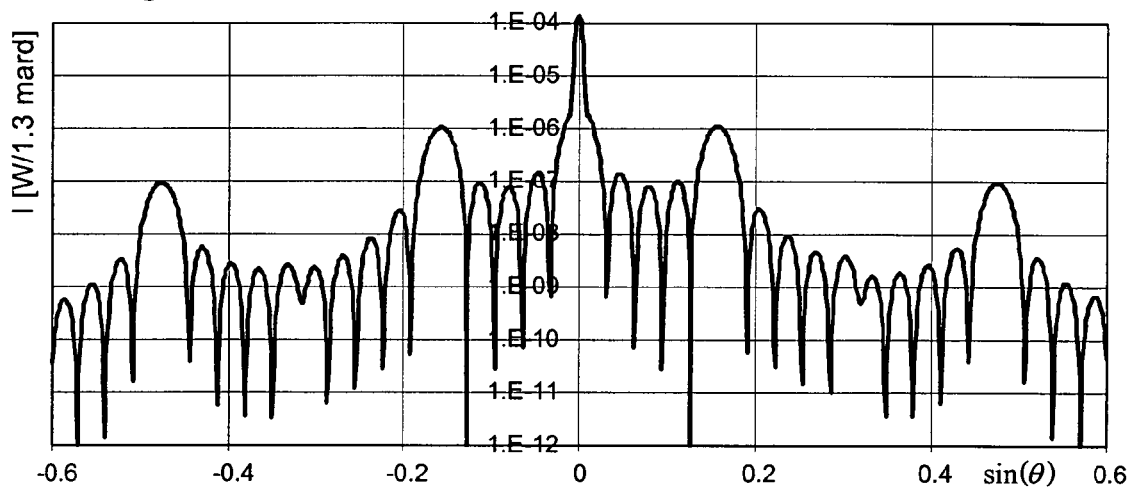
FIG. 25 is a graph of intensity in the far field in a fourth example of the invention.

FIG. 25 shows the intensity in the far field for the marker with a 4-nm rooftop that is repeated 5 times. The $1^{st}$ and $3^{rd}$ diffraction orders are clearly visible in the graph. The intensity ration between these orders is slightly higher than the expected $(\frac{1}{3})^2$ ratio which is caused by Huygen's obliquity factor $[1+\cos(\theta)]/2$ in the diffracted field. The intensity of the weak odd order has also increased considerably. Between the orders the intensity exhibits rapid oscillations. The peak intensities, however, correspond to quite an appreciable amount of photons.

Figure 26:
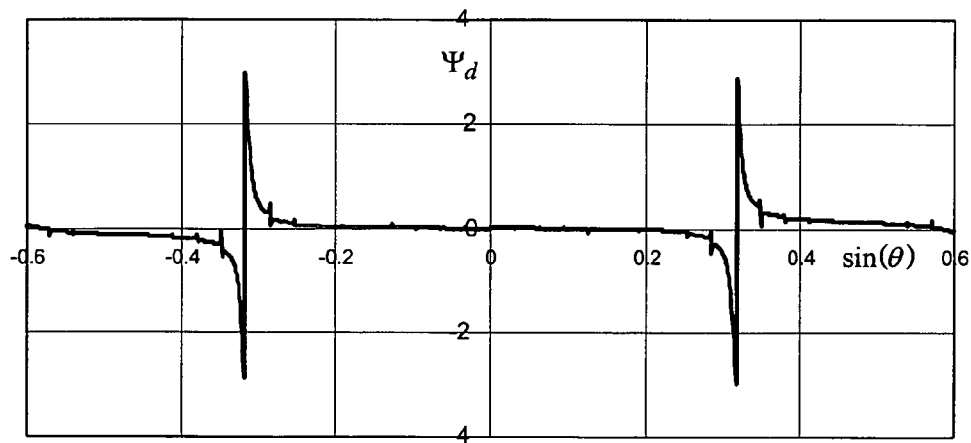
FIG. 26 is a graph of measured phase as a function of far field angle in the fourth example.

The odd phase variation in the pupil plane is shown in FIG. 26. This graph again shows the same large phase excursions in the dark area. However, compared to the case of the isolated object there are a few differences that need to be explained.

Figure 27A:
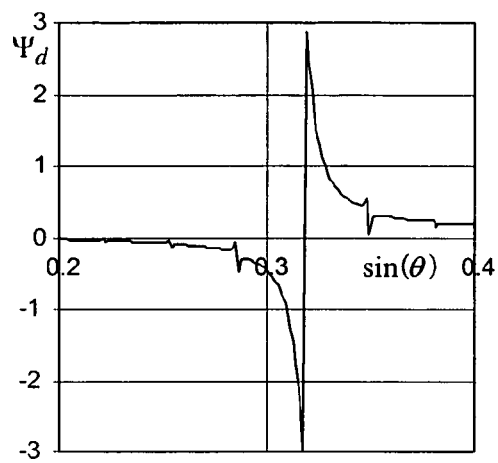
FIGS. 27A and 27B are graphs showing the effect of changing the width of the illumination beam.
Figure 27B:
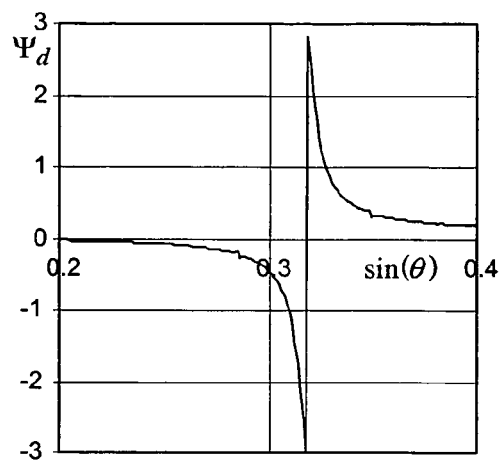

An extra small linear tilt that corresponds to a marker shift of 15 nm and the small spikes are artifacts that will not occur in a practical embodiment. A close inspection of $\Psi_d$ shows that it shows a slight stepwise variation. This is caused by the inhomogeneous illumination of the marker. Increasing the width of the illumination beam to 200 µm again results in a smooth variation of $\Psi_d$ as demonstrated in FIG. 27.

This graph clearly demonstrates the importance of the illumination profile in asymmetry measurements. Ideally a homogeneous illumination profile with a finite width is preferred. However, this requirement is in conflict with the requirement that the angular divergence of the illumination beam must be small.

A very fundamental limitation of the accuracy of an asymmetry measurement technique is surface roughness of the marker. This is not surprising since surface roughness can be considered a form of random asymmetry that introduces large and noisy phase variations in the dark regions of the interference pattern. This is demonstrated in the example below for the same grating as used in the previous section. This time, however, a 0.5 nm surface roughness was added with an average grain size of 1 µm. The illumination spot had a width of 200 µm.

Figure 28:
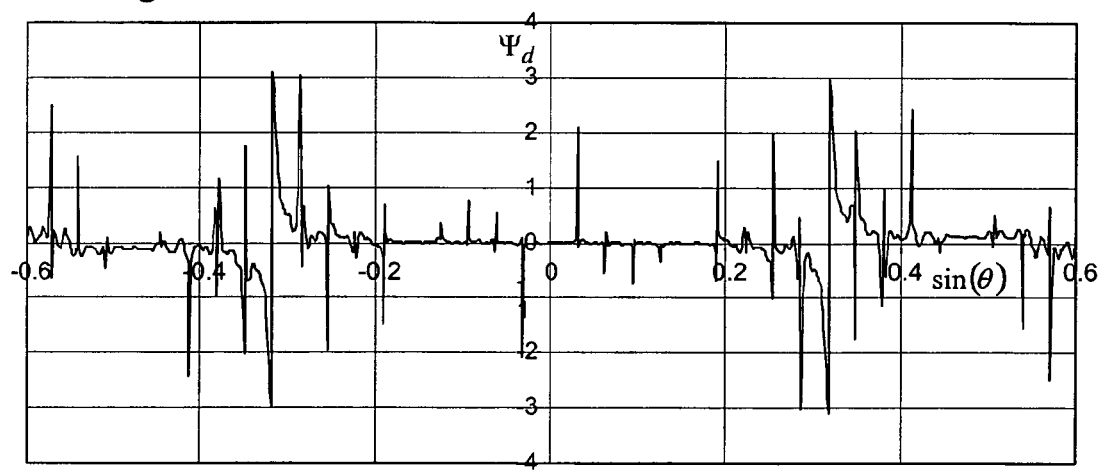
FIG. 28 is a graph of measured phase as a function of angle in a fifth example of the invention.

FIG. 28 shows measured phase in the far field and the impact of surface roughness is very clearly visible. At first sight it appears to be quite dramatic. Fortunately, there are a few reasons why the noise will be less dramatic in practical cases. First of all, the large spikes correspond to points of zero intensity (the singularities). Since the detector always has a finite spatial extent these effects will be suppressed in the detection. Secondly, in this particular example the illumination spot size is large compared to the grating width so the sensor 'sees' a lot of roughness effects in regions that are not interesting. This argument again stresses the importance of an optimum illumination spot.

The linear term of the measured phase $\Psi_d$ contains the position information. However, this position is affected by the presence of asymmetry. In order to know this asymmetry contribution we must know the 'shape' of the asymmetry as accurately as possible. The non-linear variation of the measured phase $\Psi_d$ gives information about the asymmetry. Each asymmetry has its own unique fingerprint.

In order to derive a process correction on the measured slope two different approaches can be used: a predictive recipe-like approach or a scatterometry-like approach. A recipe approach offers more possibilities with the present invention since more data can be available which allows the use of statistical techniques. A particularly useful approach is the use of 'inverse problem' techniques that are also used in scatterometry.

The measurement of asymmetry has a lot of similarities with scatterometry for CD (critical dimension) metrology applications. In the latter case, ellipsometric data is measured that is related in a very complex fashion to a certain unknown resist profile. Inverse problem techniques are applied here to recover the resist pattern. This type of measurement problem is exactly equivalent to asymmetry measurement.

An alignment sensor should preferably generate a localized signal that peaks very sharply at the location of the marker. The realization of such a sensor, however, would introduce a lot of practical problems like signal-to-noise ratio since a narrow peak requires a large measurement bandwidth. For reasons of accuracy and dynamic range phase grating alignment sensors are often used since these sensors generate a narrow-bandwidth time-limited harmonic signal.

Unfortunately, a sinusoidal signal contains multiple maxima so the marker position is not uniquely defined by one single peak. For this reason, phase grating alignment sensors require a 'capturing' mechanism that decides which of the peaks corresponds to the marker position. In the present invention, two capturing mechanisms are possible. The first makes use of the camera image that is available from the $0^{th}$ order, as discussed above. The second uses the signals that are detected in the pupil plane and requires a split photo diode. Both methods require only one short grating.

With alignment sensor 10 it is quite easy to create a sharp image of the marker using all available wavelengths simultaneously. The use of multiple wavelengths guarantees that the marker should always be visible as long as its depth is not too small. The objective lens 12 has a large NA, e.g. of 0.6, and the absence of spatial filtering yields a 'sharp' image with a resolution of the order of 1-2 µm which is more than enough to allow various camera-based capturing algorithms, using advanced image processing techniques.

With the alignment sensor 10 it is possible to generate two different types of images: a camera image after the polarizing beam splitter includes two overlapping and shifted images of the marker whereas a camera image created with a separate polarizer can show two individual images of the marker. The first type of image yields two images that are 180° degrees rotated relative to each other which is an advantage for capturing algorithms since the shape of the contour of the partially overlapping marker images can give accurate information about the marker location. However, when the pre-alignment error exceeds the scribe lane width, the marker in one image will be projected in the product structure of the other image and this may lead to robustness problems since the product structure acts as a noise source that degrades the robustness of the image processing algorithms.

The present invention can also make use of the known technique whereby two gratings with slightly different periods generate two harmonic alignment signals with a slightly different frequency. The location where two peaks of the two signals coincide is defined as the marker position. This approach has proven to be a robust technique with a sufficiently large capturing range.

However, as mentioned above, the present invention provides another capturing alternative that is especially suited to short markers with broad diffraction orders. This technique is based on the fact that the entire pupil plane is available. However, it only works if the illumination spot is larger than the marker length. The main advantage of this technique is the need for only one grating instead of two separate gratings. The technique will now be explained further.

Consider a grating with a period $X_g$ and a width $W=N.X_g$, where N is the number of grating lines. The first diffraction order has a spatial frequency $k_1$ of:

$$k_1 = 2\pi \frac{\sin(\theta)}{\lambda}. \qquad (49)$$

$$= \frac{2\pi}{X_g}$$

The diffraction order has a sin(k)/k shape and the full width of the main lobe is:

$$k_w = \frac{4\pi}{W} \quad (50)$$
$$= \frac{4\pi}{NX_g}.$$

The alignment signal of the $1^{st}$ diffraction order of this grating is measured with a split detector. Each detector element captures one half of the main lobe. The center line between the two elements is centered on the peak of the diffraction order. The average spatial frequency captured by these two detectors is about:

$$k_{a,b} \approx \frac{2\pi}{X_g} \pm \frac{\pi}{NX_g} \quad (51)$$
$$= 2\pi\left(\frac{N \pm 1}{N}\right)\frac{1}{X_g}.$$

Both detectors measure a signal with a slight difference in spatial frequency. The effective wavelength of these two signals is:

$$\Lambda_{eff} = \frac{2\pi}{|k_a - k_b|} \quad (52)$$
$$= NX_g$$
$$= W.$$

So the capturing range is equal to ±W

A second embodiment of the invention utilizes a fiber array for conducting light form the pupil plane to a detector array but is otherwise the same as the first embodiment and can be used in the same ways.

Figure 29:
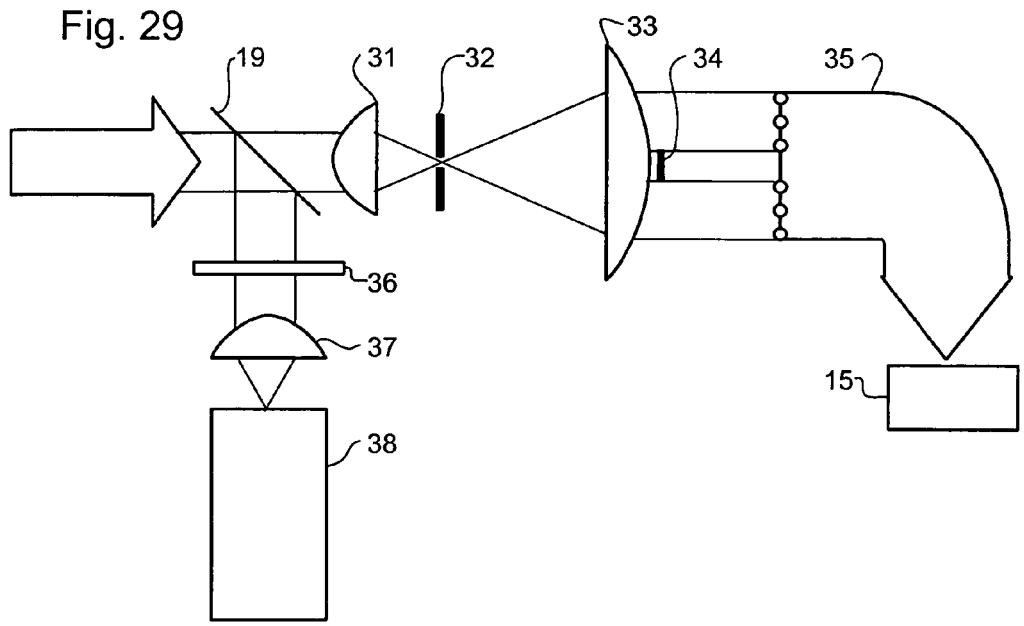
FIG. 29 depicts the detection arrangement of the alignment system of a second embodiment of the invention.

FIG. 29 shows the detector part of the alignment system of the second embodiment. The light from the self-referencing interferometer (not shown in FIG. 29) is split by polarizing beam splitter 19 into two branches, one of which is directed to a camera for capturing purposes (coarse alignment) and the other is used for the fine alignment measurement. The fine alignment branch comprises an optical system of lenses 31, 33 which re-image the pupil plane of the self-referencing interferometer onto an array of optical fibers 35 which conduct it to a remote detector array, e.g. an array of photodiodes or a CCD. The lens 31 also creates an intermediate image of the marker at the position of which an image plane filter 32, acting as an aperture stop, is provided.

The fiber bundle 35 can be arranged, with a suitable array of detectors at the end of the bundle, so that the intensity in a plurality of different positions in the pupil plane, in which the two images overlap and interfere, can be determined. The resulting data can be processed to derive the required position information. In particular to cancel some errors, the signals from pairs of fibers on opposite sides of the optical axis of the detection branch are added. This can be done by combining the pairs of fibers, by having both fibers of a pair end on the same photodetector or electronically. The detector array may comprise a plurality of discrete detectors connected to individual fibers or pairs of fibers or a position sensitive detector, such as a CCD array. Of course, the detector array itself, rather than the input end of the fiber bundle, may be located in the pupil plane but the fiber bundle allows the detector array and its associated electronics, e.g. pre-amplifiers, to be located away from temperature sensitive parts of the apparatus. A further spatial filter 34 removes the $0^{th}$ order.

Figure 30:
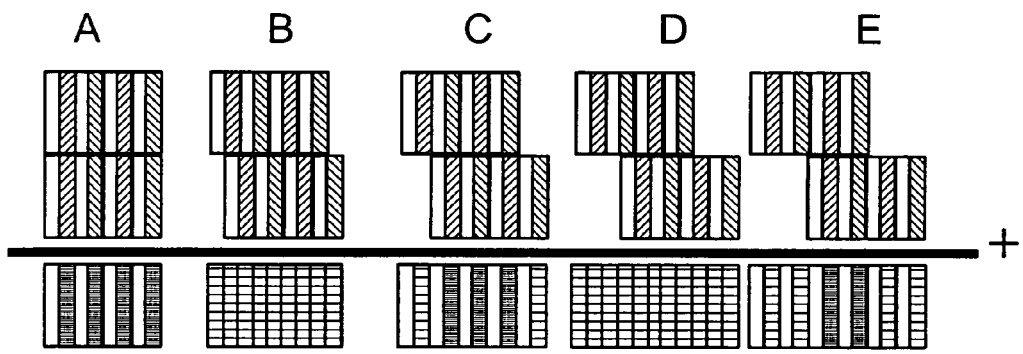
FIG. 30 is a diagram referred to in explaining the function of a camera for capturing in the second embodiment of the invention.

The use of the camera for capturing is shown in FIG. 30. This figure shows the two images of the marker, top two rows, and the sum image seen by the camera, bottom row, for various positions of the marker. In column A, the marker is coarsely aligned and the image seen by the camera has dark and light lines with a high contrast between them. As the marker moves away from alignment, the images move in opposite directions leading first to an evenly gray image, shown in column B, then to a pattern of lines, shown in column C, but with an extra line and with less contrast for the outer lines. Further movement leads again to a gray image, column D, and an image with lines, column E, again with an additional line. Image recognition software can readily detect the image with a minimum number of lines and maximum contrast.

Figure 31:
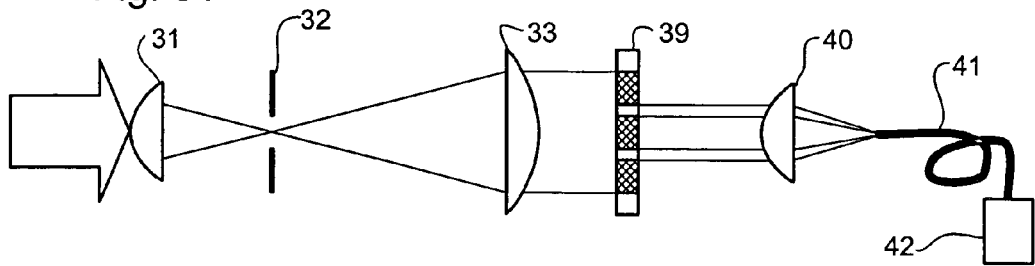
FIG. 31 depicts the detection arrangement of the alignment system of a third embodiment of the invention.

A third embodiment of the invention is the same as the first embodiment, save in the construction of the detection branch, which is shown in FIG. 31.

The detection branch of the third embodiment includes a polarizer (not shown in FIG. 31), optical system 31, 33 and image plane filter 32 as in the second embodiment. However, instead of the fiber array and detector, the third embodiment has a spatial light modulator, e.g. an LCD array (light valve) or micro-mirror array, 39 that is programmed to select part of the pupil plane, the light from which is collected by lens 40 onto fiber 41, which leads to a photo-detector 42.

The spatial light modulator 39 is programmed to select the two beams of a particular order from the overlapped Fourier transforms of the marker images, the intensity of which can then be measured by detector 42 as the marker is-scanned to derive the desired positional information. Where the marker is illuminated with a multi-wavelength light source, the different wavelengths can be separated and separately detected in the detector 42.

The third embodiment has a number of advantages, principal among which is that the alignment system can be used with any marker having 180° rotational symmetry, without having to modify the hardware. All that is required is that the spatial light modulator is appropriately programmed, which can be performed on the fly, even to align to different markers on the same substrate. The alignment system of the third embodiment can thus be compatible with known markers such as gratings, checkerboards, boxes, frames, chevrons, etc. Also, the complete pupil plane can be sampled and analyzed by repeated scans of the marker with different settings of the spatial light modulator 39.

If a polarizing beam splitter is used to create the necessary interference between the overlapping images, then, as mentioned above, two beams containing the positional information are created and the components shown in FIG. 31 may be duplicated in a separate branch to allow simultaneous detection of two orders. Further, a spatial light modulator capable of selectively redirecting light into a plurality of different directions, such as a micro-mirror array with more than two mirror positions, may be used with a corresponding number of collecting lenses, fibers and detectors, to allow detection of multiple orders in a single branch. As in the second embodiment, it is possible to dispense with fiber 41 and position a detector at the focus of collector lens 40 but the use of fiber 41 allows a heat generating or bulky detector to be located away from heat sensitive components or where more space is available.

Figure 32:
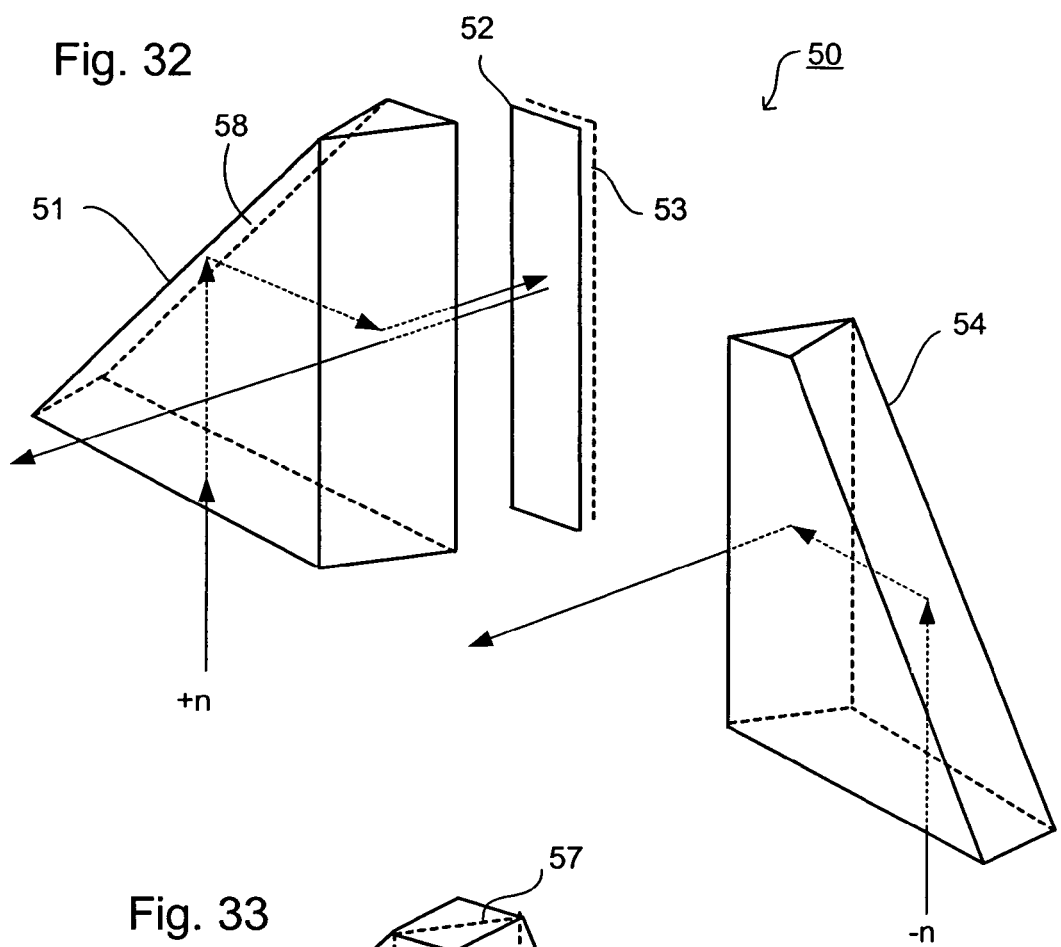
FIG. 32 is an exploded view of an order-combining prism usable in embodiments of the present invention.
Figure 33:
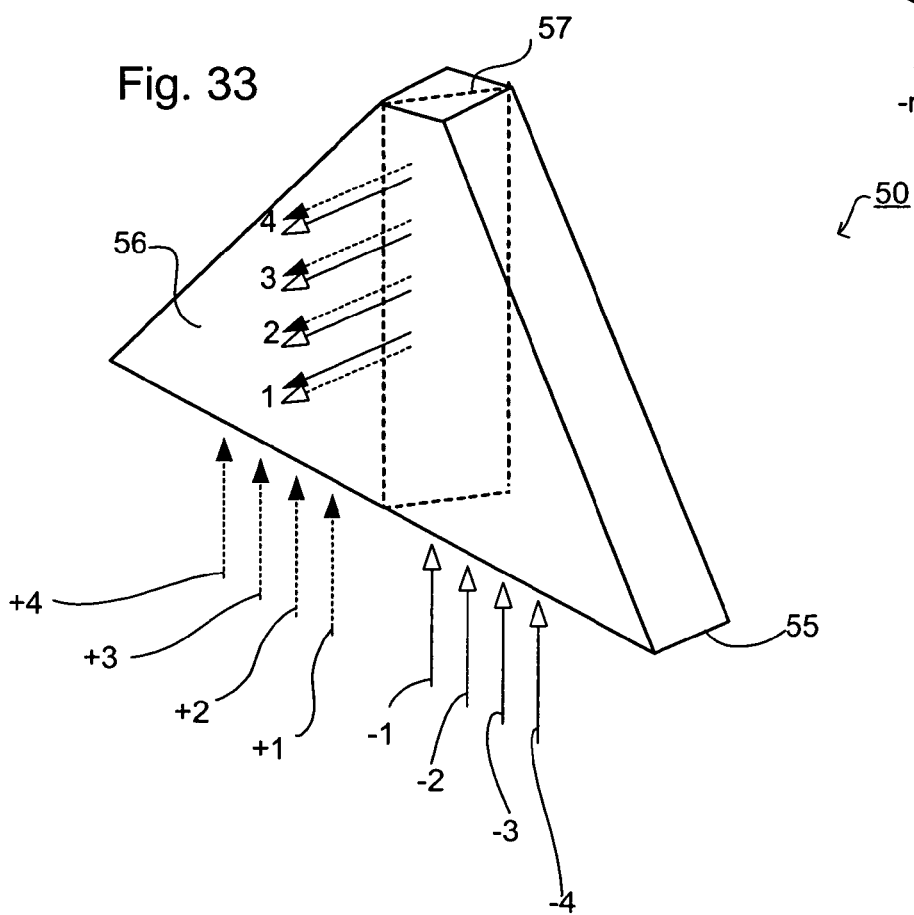
FIG. 33 is a view of the order-combining prism of FIG. 32 in assembled form showing the combination of opposite orders.

An order-combining prism which may be used in embodiments of the present invention is shown in FIGS. 32 and 33, of which FIG. 32 shows the prism in exploded form and FIG. 33 in assembled form.

In its assembled form the basic shape of the order-combining prism 50 is a triangular prism with a bottom, entrance face 55 and a side, exit face 56. The prism is divided into two halves 51, 54 by a diagonal join 57. As more clearly shown in FIG. 32, a positive order +n enters the bottom face of the first half 51, makes a total internal reflection from a side face 58 towards the join 57. The positive order is reflected backwards from the join 57, which acts as a beamsplitter surface to a quarter waveplate and mirror which are mounted to the rear face of the prism 50. These serve to rotate the polarization of the positive order and return it through the joint, beamsplitter surface 57 to exit out of the front face 56 of the prism.

Meanwhile, a negative order enters the bottom of the second half 54 and is totally internally reflected from a second side face 59 and the joint, beamsplitter surface 57 to also exit through the front face 56.

FIG. 33 shows that if the prism is located to receive symmetrically about its center positive and negative orders, orders +1 to +4 and −1 to −4 are shown, the corresponding + and − orders are combined but the first, second, etc. orders are maintained separate.

The order-combining prism may be used in the pupil plane of embodiments of the present invention to combine the opposite orders, which carry essentially the same information, for detection. Use of the order-combining prism doubles the intensity of the signal to be detected, enabling use of a lower-power light source. In addition, the resulting symmetric arrangement averages out asymmetry-induced differences between positive and negative diffraction orders. The order-combining prism of the invention is very compact and is particularly useful in situations where the space available is limited.

It will be appreciated that the order-combining prism may have other uses than in the pupil plane of an alignment system based around a self-referencing interferometer and in particular may be used in any arrangement where it is desired to combine diffractive orders located in a single plane. The prism may also be modified, e.g. to provide an equal optical path length in its two sides.

While specific embodiments of the invention have been described above, it will be appreciated that the invention may be practiced otherwise than as described. The description is not intended to limit the invention. For example, the alignment system described above may be used for alignment to markers provided on a mask or a table as well as on a substrate.

What is claimed is:

1. An alignment system, comprising:
   a self-referencing interferometer configured to project two overlapping images of an alignment mark that are relatively rotated by 180°; and
   a light intensity detector system configured to detect light intensities at a plurality of different positions in a pupil plane of the self-referencing interferometer.

2. An alignment system according to claim 1, wherein at least two positions of the plurality of positions are located substantially at the positions of different diffraction orders of light redirected by the alignment mark.

3. An alignment system according to claim 1, wherein at least two positions of the plurality of positions are located substantially equidistantly from and on opposite sides of a diffraction order of light redirected by the alignment mark.

4. An alignment system according to claim 1, wherein the light intensity detector system comprises a plurality of detecting elements located substantially in the pupil plane.

5. An alignment system according to claim 1, wherein the light intensity detector system comprises a plurality of optical fibers each having an input end located substantially in the pupil plane and an output end configured to direct light conducted through the fiber onto one of a plurality of detecting elements.

6. An alignment system according to claim 5, wherein each of the fibers is configured to direct light onto a respective one of the detecting elements.

7. An alignment system according to claim 5, wherein the fibers are provided in pairs, the input ends of the fibers of a pair being symmetrically located in the pupil plane, and the light conducted by the fibers of a pair is directed onto the same detecting element.

8. An alignment system according to claim 4, wherein the detecting elements comprise photodiodes.

9. An alignment system according to claim 4, wherein the detecting elements are elements of a CCD array.

10. An alignment system according to claim 1, wherein the light intensity detector system comprises a spatial light modulator provided in the pupil plane, the spatial light modulator being controllable to pass light from selected portions of the pupil plane, and a collector configured to collect light passed by the spatial light modulator onto a detecting element.

11. An alignment system according to claim 1, further comprising an illuminator configured to illuminate an alignment mark with light of a plurality of different wavelengths and the light intensity detector system comprises a wavelength de-multiplexor configured to direct light of different wavelengths to different detecting elements.

12. An alignment system according to claim 11, wherein the wavelength de-multiplexor comprises a blazed grating.

13. An alignment system according to claim 1, further comprising an aperture stop in an image plane located between the self-referencing interferometer and the pupil plane.

14. An alignment system according to claim 13, wherein the aperture stop has a controllable aperture.

15. An alignment system according to claim 1, further comprising a polarizing beam splitter configured to direct light output by the self-referencing interferometer into two beams and comprising two light intensity detector systems configured to receive light from respective ones of the beams.

16. An alignment system according to claim 1, further comprising a polarizing beam splitter configured to direct light output by the self-referencing interferometer into two beams, one of the beams being received by the light intensity detector system and the other by a camera.

17. An alignment system according to claim 1, wherein the light intensity detector system comprises an order-combining prism configured to receive a set of positive orders and a corresponding set of negative orders through an input face and output a combined set of orders through an output face perpendicular to the input face, the prism comprising:
   first and second halves joined at a beam splitting surface perpendicular to the input face and at 45° to the output face; and a quarter waveplate and a mirror provided adjacent a further face of the first half of the prism opposite the output face.

18. An alignment method, comprising:

aligning an alignment mark using a self-referencing interferometer that projects two overlapping images that are relatively rotated by 180° of the alignment mark by measuring the intensities of light at a plurality of different positions in a pupil plane where Fourier transforms of the images of the alignment mark interfere.

19. A method according to claim 18, wherein the plurality of different positions include positions corresponding to different diffraction orders in the Fourier transforms and fine positional information is determined from the relative phases of variations of the intensities of the different orders.

20. A method according to claim 18, wherein the plurality of different positions comprise two positions equidistantly spaced on opposite sides of a diffraction order in the pupil plane and coarse positional information is determined from the relative phases of intensity variations at the two positions on opposite sides of a diffraction order.

21. A method according to claim 18, further comprising measuring phase variations in dark areas of the pupil plane to detect asymmetries in the alignment marker.

* * * * *